United States Patent
Oosedo et al.

(10) Patent No.: US 6,902,811 B2
(45) Date of Patent: Jun. 7, 2005

(54) EPOXY RESIN COMPOSITION EXCELLENT IN WEATHER RESISTANCE AND FIBER-REINFORCED COMPOSITE MATERIALS

(75) Inventors: Hiroki Oosedo, Ehime (JP); Go Tanaka, Ehime (JP); Shinji Kouchi, Ehime (JP); Shoji Murai, Ehime (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 10/362,701
(22) PCT Filed: Jun. 26, 2002
(86) PCT No.: PCT/JP02/06423
§ 371 (c)(1), (2), (4) Date: Mar. 27, 2003
(87) PCT Pub. No.: WO03/002661
PCT Pub. Date: Jan. 9, 2003

(65) Prior Publication Data
US 2004/0031952 A1 Feb. 19, 2004

(30) Foreign Application Priority Data
Jun. 28, 2001 (JP) .................................... 2001-195974
Sep. 3, 2001 (JP) .................................... 2001-265437

(51) Int. Cl.$^7$ .......................... B32B 27/38; B62D 39/00; A63B 71/00
(52) U.S. Cl. ............. 428/413; 428/297.4; 428/300.7; 428/301.4; 296/1.01; 473/569
(58) Field of Search .................. 428/297.4, 300.7, 428/301.4, 375, 396, 413, 414; 525/533; 523/400; 296/1.01; 473/569

(56) References Cited

U.S. PATENT DOCUMENTS

| 5,106,974 A | | 4/1992 | Akimoto et al. |
| 5,766,386 A | * | 6/1998 | Sakai et al. ................ 156/62.2 |
| 6,740,266 B2 | * | 5/2004 | Sugawa et al. .............. 264/1.7 |

FOREIGN PATENT DOCUMENTS

| EP | 1 174 456 A2 | | 1/2002 | |
| JP | 11-106607 A | | 4/1999 | |
| JP | 11-106607 | * | 4/1999 | ........... C08L/63/00 |
| JP | 11-147997 A | | 6/1999 | |
| JP | 11-147997 | * | 6/1999 | ........... C08L/63/00 |
| JP | 2000-143939 A | | 5/2000 | |
| JP | 2000-336191 A | | 12/2000 | |

* cited by examiner

Primary Examiner—Michael J. Feely
(74) Attorney, Agent, or Firm—DLA Piper Rudnick Gray Cary US LLP

(57) ABSTRACT

The present invention relates to an epoxy resin composition comprising at least (A) an epoxy resin having a cycloalkane ring or cyclohexene ring but having neither aromatic ring nor aminic nitrogen atom, (B) a carboxylic anhydride having no aromatic ring, and (C) an ultraviolet absorbent, wherein a content of component (A) is from 70 to 100 percents by weight based on the total weight of epoxy resins, and a content of component (B) is from 70 to 100 percents by weight based on the total weight of carboxylic anhydrides. By this constitution, the present invention can provide an epoxy resin composition whose cured product excels in mechanical properties and weatherability, and a fiber reinforced composite material having excellent mechanical properties and weatherability.

12 Claims, 3 Drawing Sheets

EPOXY RESIN COMPOSITION EXCELLENT IN WEATHER RESISTANCE AND FIBER-REINFORCED COMPOSITE MATERIALS

TECHNICAL FIELD

The present invention relates to an epoxy resin composition excellent in mechanical properties and weatherability suitable for an application of, for example, a matrix resin for composite materials, a casting resin, a coating material, adhesives, and the like, and furthermore, it is related with a weatherproof fiber reinforced composite material used suitable for aircraft members, automobile members, ship members, sporting goods members, and the like.

BACKGROUND ART

Conventionally, a fiber reinforced composite (FRP) comprising reinforced fibers and a matrix resin has been applied to many fields, such as aircraft members, automobile members, ship members, and sporting goods members since it excels in mechanical properties, such as strength, rigidity, and impact resistance though it is lightweight.

As a matrix resin of a fiber reinforced composite material, a thermosetting resin, such as an epoxy resin, an unsaturated polyester resin, a vinyl ester resin, a phenolic resin, a cyanate resin, and a bismaleimide resin, is used in many cases, and an epoxy resin is most often used especially in a field where a comparatively high performance is required.

An epoxy resin is a typical thermosetting resin and is widely used in many fields, such as a casting resin, a coating material, adhesives, and an IC package, in addition to a matrix resin for a composite material on ground that a cured product thereof has excellent in mechanical properties such as a flexural modulus and tensile elongation, a excellent heat-resisting property, excellent chemical resistance, and small shrinkage by curing, and the like.

However, above-mentioned thermosetting resins (cured products) which are represented by an epoxy resin and which are used as a matrix resin of a composite material are poor weatherability because they are unstable against light, especially ultraviolet rays, receive a photooxidation easily to change color and get deterioration of a gloss and mechanical properties. Therefore, they are difficult to apply for uses without painting or with transparent paint under environment where it is exposed to ultraviolet rays, such as outdoors.

However, a fiber reinforced composite is not only excellent in mechanical properties, but it has been attracting an attention for some time that it is also worthy in aesthetics since the color and forms (for example, textile texture, and the like) of reinforcing fibers are in sight from the outside when a transparent matrix resin is used. Therefore, it has been desired that it is used as a structural material with an aesthetic value without painting or with transparent painting.

However, there has been a problem because coloring by ultraviolet rays might spoil aesthetic properties greatly in case a conventional thermosetting resin was used. Although there was actually an example using a fiber reinforced composite material with transparent painting as an automobile outer panel and an aerodynamic member, it had a weak point of coloring comparatively for a short period of time.

By the way, a fiber reinforced composite using an acrylate resin (thermoplastic resin) which is excellent in weatherability although insufficient in mechanical properties as a matrix resin is already put in practical use as material for decorative part for automobile interiors ["Carbon fiber in Japanese Cars", High-Performance Composites, vol.7, issue 3, p.17 (1999)]. However, an acrylate resin could be used only as material for pure decorative part, in spite of excellent weatherability, since it had a low elastic modulus and a composite material thereof had inadequate mechanical properties (especially a compressive strength, flexural strength) and it is not suitable for manufacture of a fiber reinforced composite material with a high content of reinforcing fibers because it is a thermoplastic resin.

As a method of obtaining a fiber reinforced composite material having both mechanical properties and weatherability, Japanese Unexamined Patent Publication No. 2002-105789 discloses a method using a weatherproof matrix resin near the surface and a matrix resin having excellent mechanical properties in the remaining portion. However, this method has a weak point that a manufacturing process is rather complicated, and a method by which the same performance is obtained by a single matrix resin has been desired.

Furthermore, an epoxy resin has important applications requiring weatherability, such as a coating material and adhesives, other than a matrix resin for composite materials, and an epoxy resin having a high weatherability has been desired.

In the field of plastics, generally, an ultraviolet absorbent, such as a benzotriazol derivative and a benzophenone derivative, is added for improving weatherability. However, as to a typical epoxy resin, addition of an ultraviolet absorbent has no effect and rather there was even a case that it increased a color change. Therefore, in the field of an epoxy resin, addition of an ultraviolet absorbent has scarcely been studied and there has been little information about an effective combination of an epoxy resin and an ultraviolet absorbent though it was a general approach of weather-resistance improvement of plastics.

There are some attempts to improve weatherability of an epoxy resin with no ultraviolet absorbent added.

"Introduction to Epoxy Resin" written by Soichi Muroi and Hidekazu Ishimura (Kobunshikankokai, 1988) discloses, on page 52, a composition comprising dodecahydro(bisphenol A) diglycidyl ether and Epomate B-002 (modified amine), and it discloses that a cured product thereof is excellent in a gloss retention after exposure to light.

And Japanese Unexamined Patent Publication No. 2000-143939 discloses a composition comprising dodecahydro (bisphenol A) diglycidyl ether, a cycloaliphatic epoxy resin and a carboxylic anhydride or a cationic initiator, and it discloses that a cured product thereof is excellent in a gloss retention after exposure to light.

However, a cured product of these resin compositions has inferior weatherability than other weatherproof plastics such as an acrylate resin although it has remarkably improved weatherability regarding gloss retention in comparison with an ordinary epoxy resin. And these prior art documents describe nothing about color change, or about addition of an ultraviolet absorbent.

The present invention aims to provide an epoxy resin composition excellent in mechanical properties and also in weatherability, especially with color change after exposure to light being small. Furthermore, the present invention aims to provide a fiber reinforced composite material excellent in mechanical properties and also in weatherability, especially with color change after exposure to light being small, and having an aesthetic properties originated in a reinforcing fiber tissue, by the use of a single thermosetting resin.

DISCLOSURE OF INVENTION

The inventors discovered that a specific combination of an epoxy resin and a curing agent had an exceptional characteristic that addition of a ultraviolet absorbent to it improves its weatherability remarkably, especially in small color change after exposure to light unlike general epoxy resins, though the combination itself is well-known and widely used, and completed the present invention.

Namely, the present invention relates to an epoxy resin composition comprising (A) an epoxy resin having a cycloalkane ring or a cyclohexene ring but having neither aromatic ring nor aminic nitrogen atom, (B) a carboxylic anhydride having no aromatic ring, and (C) an ultraviolet absorbent, wherein a content of component (A) is from 70 to 100 percents by weight based on the total weight of epoxy resins, and a content of component (B) is from 70 to 100 percents by weight based on the total weight of carboxylic anhydrides.

And an epoxy resin cured product of the present invention is obtained by curing the above-mentioned epoxy resin composition, and a fiber reinforced composite material of the present invention comprises reinforcing fibers and the above-mentioned epoxy resin cured product as a matrix resin.

Furthermore, a fiber reinforced composite material of the present invention comprising reinforcing fibers and a single thermosetting matrix resin, which has a color difference $\Delta E^*ab$ of not more than 4 in a 1500-hour accelerated weathering test by a sunshine carbon arc light without painting.

Figure 1:
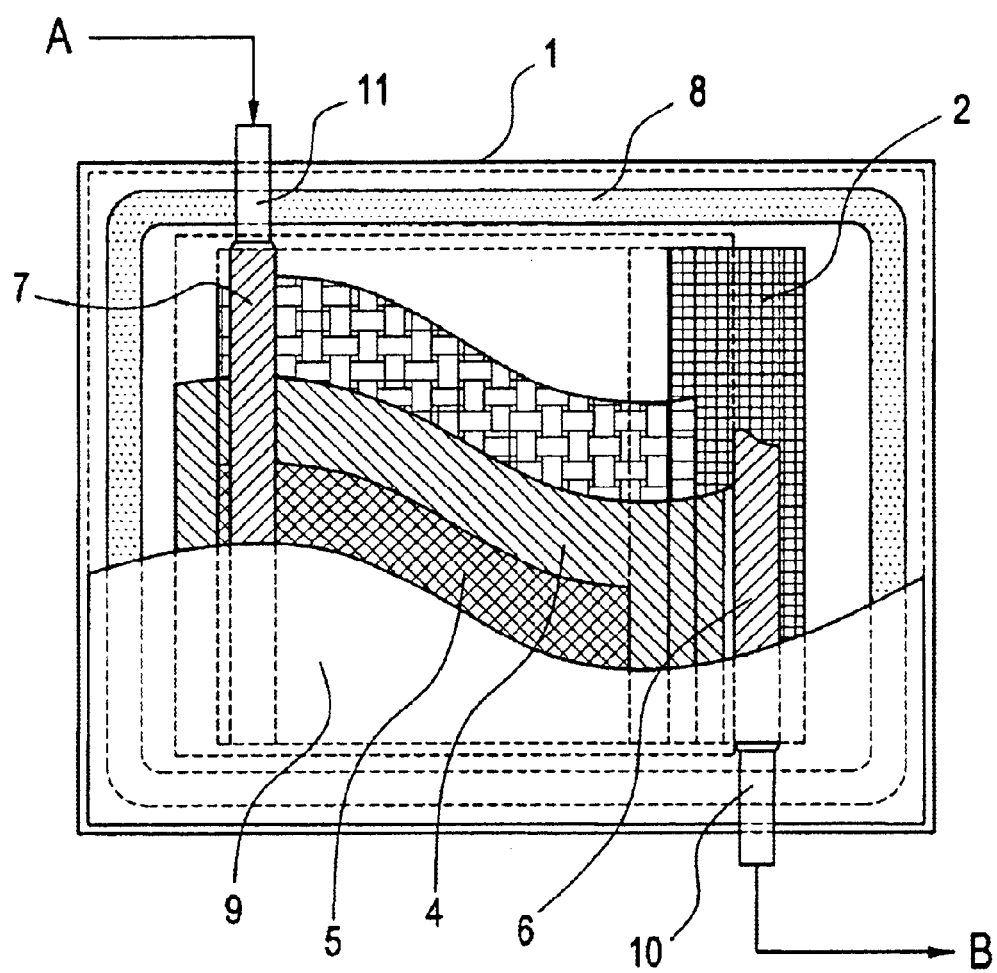
FIG. 1 shows a top plane view of a fiber reinforced composite manufacturing apparatus which has a fracture section in part in example 13.

Explanation of Codes
1 Aluminum plate
2 Glass fiber fabric
3 Carbon fiber fabric
4 Polyester taffeta
5 Mesh made of plastics
6 Channel made of aluminum
7 Channel made of aluminum
8 Silicone sealant
9 Film made of nylon
10 Tube made of polyethylene
11 Tube made of polyethylene
A Connection way to a resin container
B Connection way to a vacuum pump
12 Mold made of iron
13 Inlet
14 Runner
15 Product Side
16 Runner
17 Outlet
18 Silicone sealant
19 Reinforcing fiber substrate (Carbon fiber fabric)
20 Peel ply
21 Resin diffusion medium (Mesh made of polypropylene)
22 Film made of nylon

BEST MODE FOR CARRYING OUT THE INVENTION

In the present invention, an epoxy resin means a compound which has two or more oxirane rings in a molecule. And an epoxy resin composition means an uncured composition comprising the above-mentioned epoxy resin.

By the way, as for a conventional epoxy resin composition, epoxy resins comprising aromatic rings, represented by bisphenol A glycidyl ether, were used abundantly since mechanical properties and heat resistance of a cured product thereof were excellent. And epoxy resins comprising an aminic nitrogen atom, such as bi(4-diglycidylaminophenyl)methane or 1,3-bis (diglycidylamino-methyl) cyclohexane, were often blended in order to improve heat resistance and mechanical properties further. However, structures originating in these epoxy resins, that is, an aromatic ring and a tertiary amine structure, both tend to receive a photooxidation and furthermore an aromatic ring has a large absorbance of ultraviolet rays, and therefore, generally, a content of an epoxy resin comprising at least one of an aromatic ring and an aminic nitrogen atom is preferably small and it is more preferable not to contain it. Specifically, a content of an epoxy resin comprising at least one of an aromatic ring and an aminic nitrogen atom is preferably not more than 3 percents by weight and more preferably not more than 1 percent by weight based on the weight of an epoxy resin composition.

However, a structure derived from epoxy resins which do not comprise an aromatic ring or an aminic nitrogen atom does not receive a photooxidation easily. In order to implement mechanical properties and heat resistance without an aromatic ring or an aminic nitrogen atom, it is necessary to use an epoxy resin which comprises a cycloalkane ring (specifically, a cyclohexane ring, a cyclopentane ring, and the like) or a cycloalkene ring (specifically, cyclohexene ring, and the like) in a molecule. For this reason, an epoxy resin composition of the present invention is required to comprise an epoxy resin having a cycloalkane ring or a cycloalkene ring but having neither aromatic ring nor aminic nitrogen atom as an essential component (A). In addition, the component (A) may be either a single compound or a mixtures of two or more compounds.

Typical examples of an epoxy resin used as the component (A) include the following three kinds:

(A-1) An epoxy resin which has a 1,2-epoxycyclohexane ring or a 1,2-epoxycyclopentane ring (the so-called cycloaliphatic epoxy resin)

(A-2) Glycidyl ether of an aliphatic polyol which has a cycloalkane ring or a cycloalkene ring (A-3) Glycidyl ester of an aliphatic polycarboxylic acid which has a cycloalkane ring or a cycloalkene ring Although each of these is used preferably, especially an epoxy resin (A-1) is the most effective to improve mechanical properties and heat resistance of a cured product thereof, and it is preferable that an epoxy resin (A-1) occupies from 50 to 100 percents by weight based on the weight of the component (A).

Examples of an epoxy resin (A-1) include the followings.
4-vinylcyclohexene dioxide (formula 1),

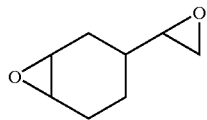
(1)

dipentene dioxide (formula 2),

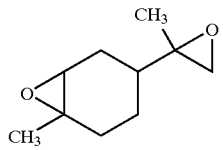
(2)

3,4-epoxycyclohexylmethyl 3,4-epoxycyclohexanecarboxylate (formula 3),

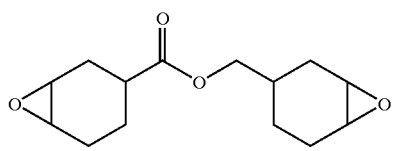
(3)

bis(3,4-epoxycyclohexylmethyl) adipate (formula 4),

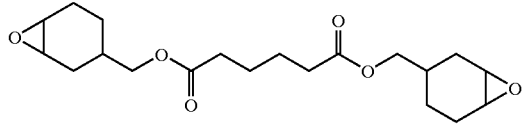
(4)

dicyclopentadiene dioxide (formula 5),

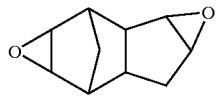
(5)

bis(2,3-epoxycyclopentyl) ether (formula 6), (6)

and an oligomer of vinylcyclohexene dioxide (formula 7).

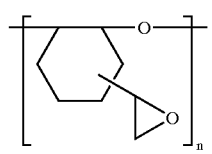
(7)

Examples of an epoxy resin (A-2) include the followings:
dodecahydrobisphenol A diglycidyl ether (formula 8),

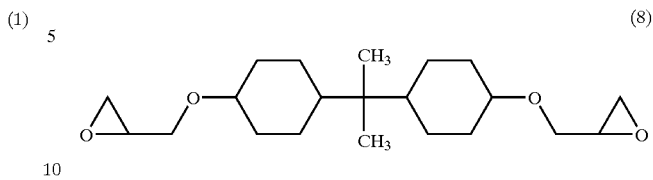
(8)

dodecahydrobisphenol F diglycidyl ether (formula 9),

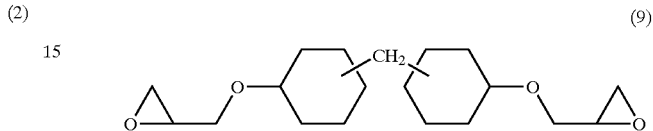
(9)

and 1,4-cyclohexanedimethanol diglycidyl ether (formula 10).

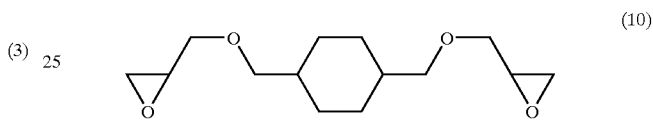
(10)

Examples of an epoxy resin (A-3) include the followings:
diglycidyl hexahydrophthalate (formula 11),

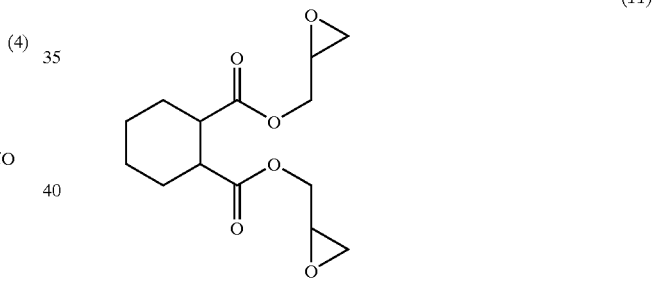
(11)

diglycidyl hexahydroterephthalate (formula 12),

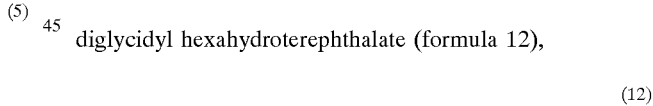
(12)

and a diglycidyl ester of dimer acid,

An epoxy resin composition of the present invention may comprise an epoxy resin having neither aromatic ring nor aminic nitrogen atom nor cycloalkane ring nor cycloalkene ring as an optional ingredient. Examples of such epoxy resins include ethylene glycol diglycidyl ether, propylene glycol diglycidyl ether, 1,4-butanediol glycidyl ether, 1,6-hexanediol diglycidyl ether, neopentylene glycol diglycidyl ether, glycerol polyglycidyl ether, diglycerol polyglycidyl ether, trimethylolpropane polyglycidyl ether, sorbitol polyglycidyl ether, and 1,4-bis(2-oxiranyl)butane.

And an epoxy resin composition of the present invention may comprise a monoepoxy compound (an epoxy compound comprising only one oxirane ring) having neither aromatic ring nor aminic nitrogen atom as an optional ingredient. Examples of such epoxy compounds include 4-tert-butyl glycidyl ether, butyl glycidyl ether, 1-butene oxide, 1,2-epoxy-4-vinylcyclohexane, and the like.

Although an epoxy resin composition of the present invention can comprise an epoxy compound other than the component (A) as mentioned above, it is preferable that the component (A) occupies from 70 to 100 percents by weight based on the total weight of all the epoxy compounds. Therefore, the ratio of the optional ingredient mentioned above in all the epoxy compounds will be in the range off from 30 to 0 percents by weight remaining. It is more preferable that the component (A) occupies from 90 to 100 percents by weight based on the total weight of all the epoxy compounds comprised in the composition.

A glycidyl ether type epoxy compound comprising an epoxy resin (A-2) and a glycidyl ester type epoxy compound comprising an epoxy resin (A-3) may, sometimes include an impurity having a carbon chlorine bond, specifically 3-chloro-2-hydroxypropyl ether, 2,3-dichloropropyl ether, 3-chloro-2-hydroxypropyl ester, 2,3-dichloropropyl ester, and the like. A carbon chlorine bond is a bond sensitive to light as known well, and it is preferable to use an epoxy compound which contains as small amount of these impurities as possible. On the other hand, an epoxy resin (A-1) has little impurity having a carbon chlorine bond, and therefore, it is preferable also from this point of view.

A chlorine atom which makes such a carbon chlorine bond is called hydroyzable chlorine, and in the present invention a content of hydrolyzable chlorine which exists in the composition is preferable to be not more than 1000 ppm by selecting raw materials of high purity.

A polyamine, a polyphenol, a polymercaptan, or a carboxylic anhydride is commonly used as a curing agent of an epoxy resin.

However, a polyamine contains aminic nitrogen atoms which are easy to oxidize, a polyphenol brings phenyl ether structures which are easy to oxidize to the cured product above all among aromatic compounds, and polymercaptan brings sulfide bonds which is easy to oxidize to a cured product, and therefore, each of these is disadvantageous in regards to weatherability.

Generally both a carboxylic anhydride having an aromatic ring and a carboxylic anhydride having no aromatic ring are used as a curing agent of an epoxy resin. However, to use a carboxylic anhydride having an aromatic ring has a bad influence in weatherability since an ultraviolet absorbance of the cured product is large. There is no problem in case of a carboxylic anhydride having no aromatic ring. Theoretically, it is expected that there is a bad influence upon weatherability if an aminic nitrogen atom is contained in a carboxylic anhydride. However, there is no problem here since a carboxylic anhydride used usually as a curing agent of an epoxy resin does not contain a nitrogen atom. Therefore, it is essential that an epoxy resin composition of the present invention comprises a carboxylic anhydride having no aromatic ring which is the component (B) as a curing agent.

Furthermore, as well as a case of an epoxy resin, it is effective to use a carboxylic anhydride having a cycloalkane ring or as cycloalkene ring in order to improve a heat resistance and mechanical properties of the cured product. Examples of carboxylic anhydride having such a cycloalkane ring include the followings:

hexahydrophthalic anhydride (formula 13),

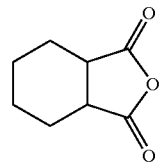

(13)

methylhexahydrophthalic anhydride (formula 14),

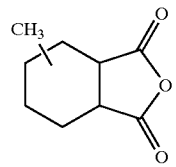

(14)

methyldihydronadic anhydride (formula 15),

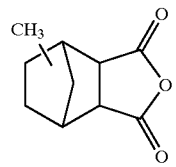

(15)

and cyclopentanetetracarboxylic dianhydride (formula 16).

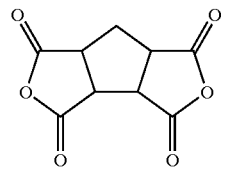

(16)

Examples of carboxylic anhydride having a cycloalkene ring include the followings:

1,2,3,6-tetrahydrophthalic anhydride (formula 17),

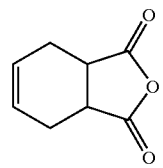

(17)

methyl-1,2,3,6-tetrahydrophthalic anhydride (formula 18),

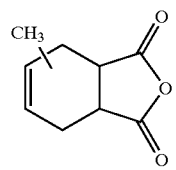

(18)

nadic anhydride (formula 19),

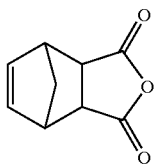
(19)

methylnadic anhydride (formula 20),

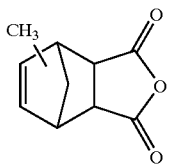
(20)

bicyclo[2.2.2.]oct-7-ene-2,3,5,6-tetracarboxylic dianhydride (formula 21),

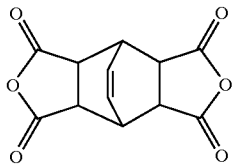
(21)

and 4-(2,5-dioxotetrahydrofuran-3-yl)-3-methyl-1,2,5,6-tetrahydrophthalic anhydrides (formula 22).

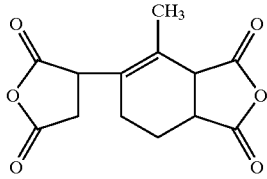
(22)

An epoxy resin composition of the present invention may comprise a carboxylic anhydride having neither aromatic ring nor cycloalkane ring nor cycloalkene ring as an optional ingredient. Examples of such carboxylic anhydride include succinic anhydride, 2-alkylsuccinic acid, and 2-alkenylsuccinic acid.

In an epoxy resin composition of the present invention, it is preferable that a carboxylic anhydride of the component (B) occupies from 70 to 100 percents by weight based on the total weight of all kinds of carboxylic anhydride. It is more preferable that a carboxylic anhydride of the component (B) occupies from 90 to 100 percents by weight based on the total weight of all kinds of carboxylic anhydride.

In a resin composition of the present invention, a ratio of the number of moles of epoxy groups and the number of moles of carboxylic anhydride groups in one kilogram of the composition (stoichiometric ratio) is preferably from 35:65 to 80:20. If the ratio of the number of moles of epoxy groups is too small, a sufficient crosslinking structure will not be formed, and neither heat resistance nor mechanical properties will be obtained. On the other hand, when the ratio of the number of moles of epoxy groups is large, formation of crosslinking structure is possible since epoxy groups are capable of homopolymerization. However, when the ratio of the number of moles of epoxy resins is too large, there are possibilities that curing velocity may become slow and that the cured product may become brittle, and therefore the ratio of the number of moles of epoxy groups is preferably within the range mentioned above. Generally, addition of ultraviolet absorbent is known as a procedure of preventing degradation by ultraviolet radiation of plastics. However, in conventional epoxy resins, even if an ultraviolet absorbent is added as stated above, degradation by ultraviolet radiation, especially coloring, has not been improved, but sometimes it becomes worse on the contrary.

However, the inventors found out that addition of an ultraviolet absorbent to an epoxy resin composition comprising the component (A) and the component (B) of the present invention has a remarkable improvement effect. Therefore, an epoxy resin composition of the present invention employs an ultraviolet absorbent as the component (C).

Examples of ultraviolet absorbent include compounds such as phenylsalicylate type, benzophenone type, benzotriazol type, and acrylate type, and in the present invention, a benzotriazol type ultraviolet absorbent is the most preferable since stabilizing effect on color change is large. A benzophenone type ultraviolet absorbent is next preferable.

A benzotriazol type ultraviolet absorbent is a group of compounds which have a skeleton of 2-(2-hydroxyphenyl)-2H-benzotriazol, and examples thereof include the followings:

2-(3-tert-butyl-2-hydroxy-5-methylphenyl)-2H-benzotriazol (formula 23),

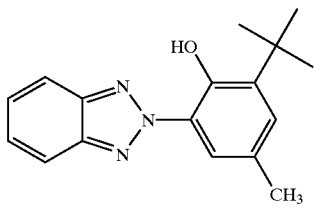
(23)

2-(3,5-di-tert-butyl-2-hydroxyphenyl)-2H-benzotriazol (formula 24),

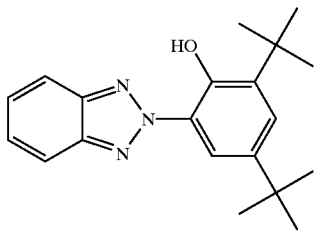
(24)

2-(2-hydroxy-3,5-di-tert-pentylphenyl)-2H-benzotriazol (formula 25), (25)

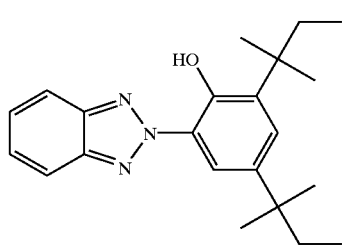

2-(3,5-bis(α,α-dimethylbenzyl)-2-hydroxyphenyl)-2-H-benzotriazol (formula 26), (26)

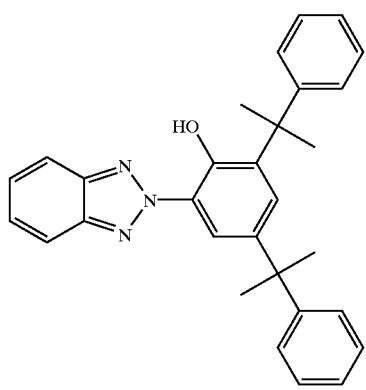

2,2'-methylenebis[6-(2H-benzotriazol-2-yl)-4-(1,1,3,3-tetramethylbutylphenol] (formula 27), (27)

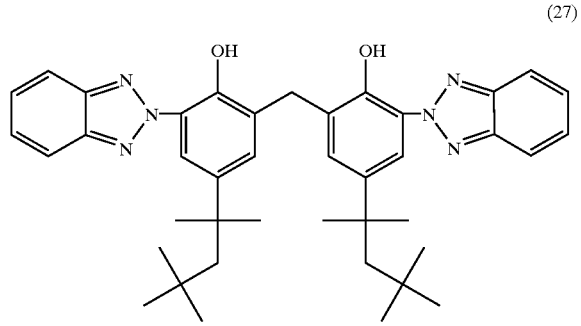

2-(2-hydroxy-5-methyl-3-(3,4,5,6-tetrahydrophthalimide methyl)phenyl)-2H-benzotriazol (formula 28), (28)

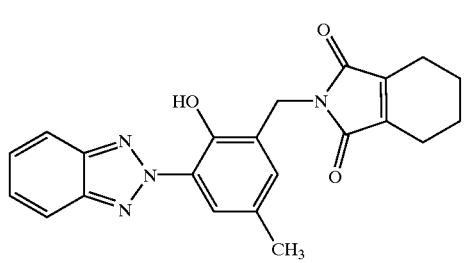

2-(3-tert-butyl-2-hydroxy-5-methylphenyl)-5-chloro-2-H-benzotriazol (formula 29), (29)

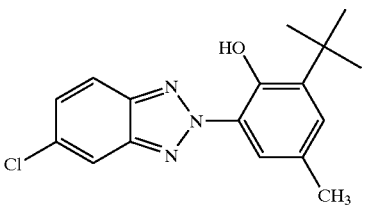

5-chloro-2-((3,5-di-tert-butyl-2-hydroxyphenyl)-2-H-benzotriazol (formula 30), (30)

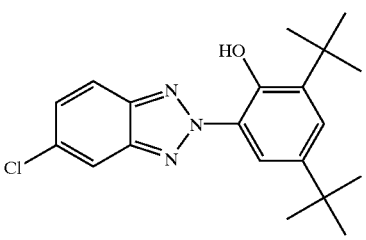

2-(2-hydroxy-5-methylphenyl)-2-H-benzotriazol (formula 31), (31)

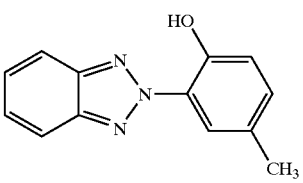

and 2-(2-hydroxy-5-tert-octylphenyl)-2H-benzotriazol (formula 32).

(32)

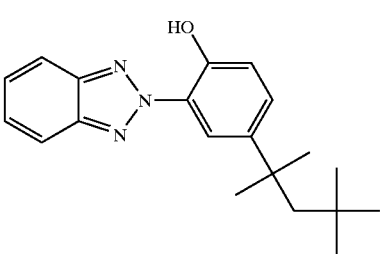

A benzophenone type ultraviolet absorbent is a group of compounds which have a skeleton of 2-hydroxybenzophenone, and examples thereof include the followings:

2,4-dihydroxybenzophenone (formula 33), (33)

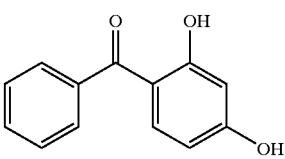

2-hydroxy-4-methoxybenzophenone (formula 34),

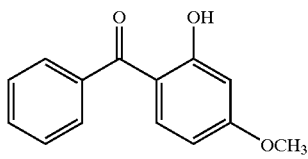
(34)

4-octyloxy-2-hydroxybenzophenone (formula 35),

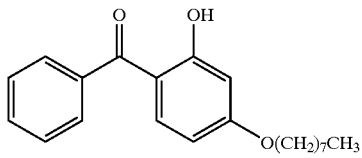
(35)

4-dodecyloxy-2-hydroxybenzophenone (formula 36),

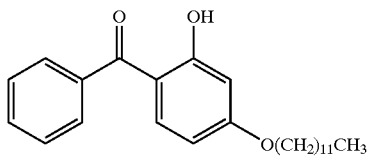
(36)

4-benzyloxy-2-hydroxybenzophenone (formula 37),

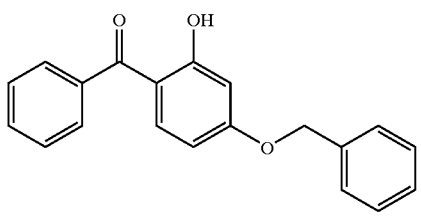
(37)

2,2',4,4'-tetrahydroxybenzophenone (formula 38),

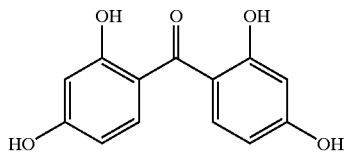
(38)

and 2,2-dihydroxy-4,4'-dimethoxybenzophenone (formula 39).

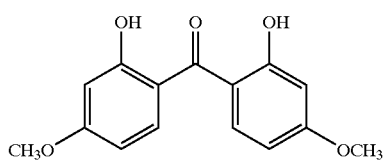
(39)

In an epoxy restin composition of the present invention, an amount of addition of the above-mentioned ultraviolet absorbent is preferably from 0.01 to 1.0 percents by weight and more preferably from 0.01 to 0.5 percents by weight based on the total weight of the component (A) and the component (B). It is because enough weatherability will not be obtained if the amount of addition of ultraviolet absorbent is too small, and because there is a possibility that coloring of the obtained epoxy resin cured product may be conspicuous since an ultraviolet absorbent itself has a slight color and that the heat resistance of the epoxy resin may decrease according to plasticization effect if the amount of addition of ultraviolet absorbent is too large.

When effect of various kinds of ultraviolet absorbents was compared in detail, it turned out that there is a correlation between the spectral characteristic and the weatherproof improvement effect of an ultraviolet absorbent and that mostly good weatherability is shown, although there are a few exceptions, when an ultraviolet absorbent having a molecular extinction coefficient in 380 nanometers of not less than $5.0 \times 10^2$ is used. However, a too large molecular extinction coefficient in 380 nanometers is not preferable because color of an ultraviolet absorbent itself becomes strong. Therefore, in the present invention, it is preferable to use an ultraviolet absorbent having a molecular extinction coefficient in 380 nanometers of from $5.0 \times 10^2$ to $2.0 \times 10^4$. A molecular extinction coefficient mentioned above is a value obtained by dividing an absorbance at one-centimeter optical path length of solution by a molar concentration. As for a molecular extinction coefficient of an ultraviolet absorbent, the value measured at 25 degrees Celsius in chloroform shall be used.

Curing reaction of epoxy resin and carboxylic anhydride requires comparatively high temperature as it is. Some technology enabling to cure at lower temperature by adding a cure accelerator is known in order to adapt various uses. However, if an unsuitable one is used as a cure accelerator, stability against ultraviolet rays will fall.

As a cure accelerator not to reduce stability against ultraviolet rays, the inventors found out the following components (D) and (E). An epoxy resin composition of the present invention can comprise either or both of components (D) and (E) as optional components.

Component (D): Imidazole compound
Component (E): Polyol having neither aromatic ring nor aminic nitrogen atom Preferable examples of component (D) include 1-methylimidazole, 2-methylimidazole, 4-methylimidazole, 1,2-dimethylimidazole, 2-ethylimidazole, 2-isopropylimidazole, 2-ethyl-1-methylimidazole, 2-ethyl-4-methylimidazole, 2-undecylimidazole, 2-heptadecylimidazole, and 1-isobutyl-2-methylimidazole.

The amount of addition of these imidazole compounds is preferably not more than 3.0 percents by weight based on the total weight of component (A) and component (B). When the amount of addition is more than 3.0 percents by weight, preservation stability of epoxy resin composition will reduce undesirably.

Preferable examples of component (E) include ethylene glycol, diethylene glycol, propylene glycol, dipropylene glycol, 1,3-propanediol, 1,2-butanediol, 1,4-butanediol, neopentylene glycol, glycerol, trimethylolpropane, 1,4-cyclohexanediol, 1,4-cyclohexanedimethanol, dodecahydrobisphenol A, dodecahydrobisphenol F, ethylene oxide addition product of dodecahydroblisphenol A, and propylene oxide addition product of dodecahydrobisphenol A.

The amount of addition of polyol having neither aromatic ring nor aminic nitrogen atom is preferably not more than 10.0 percents by weight based on the total weight of component (A) and component (B). If the amount of addition is more than 10.0 percents by weight, preservation stability of the epoxy resin composition will reduce undesirably.

An epoxy resin composition of the present invention can be further blended with dye, organic or inorganic particles (pigment, filler, thixotropic agent, conductive particle, and the like), staple fiber, surfactant, a macromolecular compound such as poly(methyl acrylate), and the like.

There are a method using outdoor exposure and a method using a commercial weatherometer as a method of evaluating weatherability of an epoxy resin cured product. Examples of a weatherometer include test machines using a carbon arc light, a xenon lamp, a metaling lamp, and the like as a light source. A method using a weatherometer is excellent in a short measurement time and good reproducibility.

In a weatherometer test using as a light source a metaling lamp which can be evaluated comparatively in a short time, color difference $\Delta E^*ab$ which is quantitative index of color change after performing a 100-hour weatherometer test for a board with a thickness of 2 millimeters for a cured product of epoxy resin composition of the present invention is preferably not more than 5 and more preferably not more than 3. Herein, conditions of the weatherometer test using a metaling lamp as a light source are defined as follows. Illumination is 2 kW/m². One cycle consisting of exposure for 12 minutes with spraying of water on conditions of black panel temperature of 63 degrees Celsius and relative humidity of 98 percents and exposure for 48 minutes without spraying of water on conditions of black panel temperature of 63 degrees Celsius and relative humidity of 50 percents is repeated 100 times (namely, 100 hours). Color difference $\Delta E^*ab$ is measured as follows. Colorimetry by transmitted light is performed at C light source and angle of fields of 2 degrees about a sample before a weatherometer test and a sample after the test, and calorimetric value by CIE 1976 L*a*b* color system is calculated. When calorimetric value before an accelerated weathering test is represented by $(L^*_1, a^*_1, b^*_1)$ and colorimetry value after the test is represented by $(L^*_2, a^*_2, b^*_2)$, color difference resulted from the accelerated weathering test is obtained by the following formula:

$$\Delta E^*ab = [(L^*_1 - L^*_2)^2 + (a^*_1 - a^*_2)^2 + (b^*_1 - b^*_2)^2]^{1/2} \quad (1)$$

A fiber reinforced composite material of the present invention comprises reinforcing fibers and a single thermosetting matrix resin, and has color difference $\Delta E^*ab$ of not more than 4 in a 1500-hour weatherometer test by a sunshine carbon arc light without painting, and it can be implemented by using a cured product of above-mentioned epoxy resin composition as a matrix resin.

Carbon fibers, glass fibers, aramid fibers, silicon nitride fibers, boron fibers, and metal fibers are used preferably as reinforcing fibers used for a fiber reinforced composite material of the present invention. And fibers with gloss or thin film interference color with a thin film of metal or the like on the surface thereof by processing a vapor deposition, a sputtering, an ion plating, CVD, non-electrolytic plating, electrolytic plating, or the like on transparent reinforcing fibers, such as glass fibers or aramid fibers, can also be used. Among these, carbon fibers are the most preferable since they are suitable to obtain a fiber reinforced composite material excellent in specific strength, specific modulus and other mechanical properties.

It is also possible to use two or more kinds of reinforcing fibers, and a combination of two or more kinds of reinforcing fibers having different color or gloss can improve aesthetic properties. And fibers except above-mentioned preferable reinforcing fibers may be combined. Specifically, examples thereof include a combination of dyed synthetic or natural fibers, or synthetic fibers colored by pigment compounding in order to improve a decorative design.

These reinforcing fibers can be used after processed into forms such as woven, knitted, braided or the like. In such a case, the fabric (for example, plain weave, twill weave, satin weave, and the like) can be chosen in consideration of design effect, and it is also possible to express characters, pictures, and the like by the fabric.

As a method of combining two or more kinds of fibers, there are a method of using different kinds of fibers as warp and woof of woven fabric, a method of using two or more kinds of fibers as warp or woof of woven fabric, a method of laminating two or more kinds of substrates consisting of different kinds of fibers, and the like.

A fiber reinforced composite of the present invention can be obtained by heating to cure after impregnating above-mentioned reinforcing fiber with above-mentioned weatherproof epoxy resin composition. Generally a glass transition temperature of a cured product of a thermosetting resin correlates with a molecular structure and a curing temperature, and in the case of a thermosetting resin having a suitable molecular structure, the higher a curing temperature is, the higher a glass transition temperature of the cured product is. A glass transition temperature of a matrix is correlated with heat resistance regarding mechanical properties of a fiber reinforced composite material, that is, characteristic to retain mechanical properties even at an elevated temperature, and is preferably not less than 90 degrees Celsius. In manufacture of a fiber reinforced composite of the present invention, it is preferable to cure at a temperature of not less than 80 degrees Celsius in order to make the matrix have a glass transition temperature of not less than 90 degrees Celsius. A curing time its usually from 10 minutes to 3 hours.

Sometimes a matrix resin is cured partially at a certain temperature (precuring), and thereafter is cured at a higher temperature again (aftercuring). Since it is the aftercuring temperature that influences a glass transition temperature of the cured product, the aftercuring temperature is preferably not less than 80 degrees Celsius when curing in such a process.

As a process for preparing a fiber reinforced composite of the present invention, each well-known method, such as a hand layup method, a prepreg method, the RTM method, a pultrusion method a filament winding method, and a spray up method, can be used preferably. An RTM method which is one of preferable preparing processes is a method of injecting a liquid thermosetting resin into a reinforcing fiber substrate placed in a mold and curing to obtain a fiber reinforced composite.

As a reinforcing fiber substrate, woven fabric, knit, mat, braid, or the like which consists of reinforcing fibers may be used as it is, or a preform obtained by laminating these substrates to give a shape and fixing the shape with means of binder, stitch, or the like may be used, too.

As a mold, a closed mold made of rigid material may be used, or a method using a rigid single-sided mold and a flexible film (bag) can be used, too. In the latter case, a reinforcing fiber substrate is placed between the rigid single-sided mold and the flexible film. Various kinds of existing materials, such as metal (iron, steel, aluminum, and the like), FRP, wood, gypsum, and the like are used as material of a rigid mold. A film of nylon, fluororesin, silicone resin, or the like is used as a flexible film.

When using a rigid closed mold, usually the mold is clamped by pressure, and a liquid epoxy resin composition is injected into the mold by pressurization. At this time, it may be equipped with a suction port, connected to a vacuum pump to suck, apart from an inlet. It is also possible to suck and pour a liquid epoxy resin only by atmospheric pressure without using special pressurizing means.

When using a rigid single-sided mold and a flexible film, suction and injection by atmospheric pressure are usually used. It is effective to use a resin distribution medium as shown in the U.S. Pat. No. 4,902,215 in order to achieve good impregnation by injection by atmospheric pressure. And it is also possible to obtain a composite united with a foam core, a honeycomb core, metal parts, or the like by placing it or them in addition to a reinforcing fiber substrate in the mold. Especially a sandwich structure product obtained by placing a carbon fiber substrate on both sides of a foam core and by molding has a light weight and a large flexural rigidity, and therefore it is useful as material of an outer panel of, for example, an automobile, an airplane, and the like. Furthermore, it is sometimes preferable to apply the below-mentioned gelcoat on the surface of rigid mold in advance of placing a reinforcing fiber substrate.

Viscosity of a liquid epoxy resin composition at the temperature of the mold at the time of resin injection is preferably within the range of from 10 to 1000. mPa·s in either case of using a closed mold and using a single-sided mold. When the viscosity is too high, it takes too much time to impregnate and there is a possibility that productivity may decrease. And there is a possibility that impregnation may be poor both when the viscosity is too low and when it is too high.

After resin injection is completed, it is heated to cure by the use of a suitable heating means and is demolded. As mentioned above, it may be also postcured after demolding if needed.

A weatherometer test of a fiber reinforced composite of the present invention can be an outdoor exposure and weatherometer test as well as a case of a resin cured product, and although the same weatherometer test can be used, methods using a carbon arc as a lightsource are often used in a field of automobile, architecture, and the like. Specifically, it is performed by making a 1500-hour test by a sunshine carbon arc light type test carried in JIS K5400-1990 (corresponding to ISO 4892-4:1994), and finding a surface color difference between before the test and after the test.

A color difference $\Delta E^*ab$ is measured as follows. A colorimetry is performed by a reflected light with C light source and an angle of visibility of 2 degrees about a sample before making a weatherometer test and a sample after the test, and finding a colorimetric value by CIE 1976 color system. A color difference $\Delta E^*ab$ resulting from a weatherometer test is obtained by the following equation:

$$\Delta E^*ab=[(L^*_1-L^*_2)^2+(a^*_1-a^*_2)^2+(b^*_1-b^*_2)^2]^{1/2} \quad (1)$$

wherein $L^*_1$, $a^*_1$, and $b^*_1$ are colorimetric values before making a weatherometer test, and $L^*_2$, $a^*_2$, and $b^*_2$ are colorimetric values after the test.

The above-mentioned color difference between before test and after test $\Delta E^*ab$ is required to be not more than 4, and is preferred to be not more than 3 since the change of color tone is less noticeable.

A weatherometer test of a fiber reinforced composite material of the present invention may also be made by the use of a weatherometer using a metaling lamp as a light source. This evaluation method is useful when evaluating rough weatherability for a short time. In this case, preferable test conditions are the same as those of weatherability evaluation of a resin cured product. However, conditions of measurement of color difference are the same as those of the above-mentioned test of a fiber reinforced composite material using a carbon arc light type testing machine. In this case, the above-mentioned color difference before test and after test $\Delta E^*ab$ is preferred to be not more than 4, and is more preferred to be not more than 3.

An elastic modulus of a matrix resin of a fiber reinforced composite material correlates with mechanical properties, compressive strength, flexural strength, tensile strength, and the like of a fiber reinforced composite material. Therefore, a room temperature flexural modulus of a fiber reinforced composite material of the present invention is preferably not less than 2.9 GPa and is more preferably not less than 3.1 GPa. A room temperature flexural modulus of a thermosetting matrix resin of a fiber reinforced composite of the present invention is obtained by taking a flexural measurement according to the method carried in JIS K7203 of a sample obtained by injecting a used thermosetting matrix resin into a mold with a cavity having a thickness of 2 millimeters, curing by providing the same heat history as molding of a fiber reinforced composite, and cutting into a rectangle.

A glass transition temperature of a thermosetting matrix resin of a fiber reinforced composite of the present invention is obtained by a differential scanning calorimetric analysis of a small piece of the fiber reinforced composite.

A matrix needs to be transparent in order to obtain a fiber reinforced composite material whose reinforcing fiber tissue is visible. Because a cured product of an epoxy composition consisting only of components (A), (B), and (C) is transparent in most cases, if only blending of an additive which spoils transparency, for example, blending of a large quantity of pigments or inorganic fillers, is avoided, a cured product of a resin composition of the present invention is transparent and is suitable for a matrix of a fiber reinforced composite material whose reinforcing fiber tissue is visible. Furthermore, a fiber reinforced composite of the present invention may have a structure where a transparent resin layer is applied on the designed surface. Herein, a designed surface means, among the surfaces of a fiber reinforced composite, a surface which is observable in a manner of ordinary use and requires a beautiful spectacle. A designed surface needs weatherability since it is put under an environment where it is exposed to a natural light in many cases. In case of a plate-shaped fiber reinforced composite, there are both cases that the surface of only one side corresponds to it and that the surfaces of the both sides correspond to it, but in case of an outside plate of a machine, usually the surface of only one side corresponds to it. In case of a hollow, namely tube-shaped, or box-shaped fiber reinforced composite, the outside surface usually corresponds to a designed surface. In case of a solid, for example a bar-shaped, fiber reinforced composite, the whole surface usually corresponds to a designed surface.

One of methods of providing a transparent resin layer on a designed surface is coating by a transparent paint. And another practicable method is to apply a transparent gelcoat to a mold when molding by an RTM method, a hand lay up method, a spray up method, or the like. Further another practicable method is to laminate a film of thermoplastic resin or thermosetting resin on the surface. A plurality of these transparent resin layers may be applied. Examples of a method of applying a plurality of transparent resin layers include to use a gelcoat and a transparent coating together, to apply a transparent coating consisting of two or more layers, and the like. A decorative design can be further improved by adding colorants such as dye and pigment, metal powders, scaly fillers, and the like to a transparent resin layer applied on a designed surface in the range of not spoiling such transparency that reinforcing fibers are visible. Although a transparent resin layer applied on a designed surface must have excellent weatherability needless to say, all the known weatherproof materials can be used for it because special mechanical properties are not required. In case of applying a transparent resin layer on a designed surface, weatherability in the state that a transparent resin layer is applied is of course essential. It is evaluated by making a 1500-hour test about the outside surface by a sunshine carbon arc light type test carried in JIS K5400-1990 (corresponding to ISO 4892-4: 1994), and finding the difference of color of the outer surface between before test and after test. It is preferable that $\Delta E^*ab$ is not more than 4, and it is more preferably that the color difference is not more than 3.

On the other hand, when evaluating weatherability of a fiber reinforced composite of a substrate of a fiber reinforced composite with a transparent resin layer applied on a designed surface, if there is an almost flat surface without a transparent resin layer, you should evaluate weatherability of that surfaces, and if not, you should remove a transparent resin layer by solvent exfoliation or polishing and evaluate weatherability of the resulting surface.

An epoxy resin composition of the present invention is used suitably as a coating material and adhesives which are used outdoors since it excels in weatherability. On the other hand, a conventional epoxy resin coating has been given weatherability by adding a large quantity of pigment or filler. According to the present invention, a transparent epoxy resin coating can be obtained and it is useful. When using an epoxy resin composition of the present invention as a coating material or adhesives, it is used in a method of applying a non-solvent composition and thereafter heating to cure it, or in a method of applying a solution of and epoxy resin composition of the present invention and thereafter vaporizing the solvent and heating to cure it.

When using an epoxy resin composition of the present invention for casting, a cast is obtained by injecting a non-solvent compositions into a mold and heating to cure.

An epoxy resin composition of the present invention can be suitably used as a matrix of a fiber reinforced composite material since it excels in mechanical properties or heat resistance of a cured product thereof.

A fiber reinforced composite material requiring a designed surface requires a high-level surface flatness and smoothness and image clarity of the designed surface. In order to satisfy these requirements, precise polishing of a mold, and appropriate selecting and applying of a gelcoat and a coating material are necessary. As to the surface flatness and smoothness of a designed surface of a fiber reinforced composite material of the present invention, an average-of-roughness-height Ra obtained by taking a surface roughness measurement in a conformity with JIS B 0601 (corresponding to ISO 468:1982) is preferably from 0.05 to 2.0 micrometers, and is more preferably from 0.05 to 1.3 micrometers. A maximum height Ry obtained by taking the same surface roughness measurement is preferably in the range of from 0.1 to 5.0 micrometers, and is more preferably in the range of from 0.1 to 3.0 micrometers. If Ra or Ry is larger than the above-mentioned range, a roughness will be conspicuous in an appearance or a touch. Even if Ra or Ry is smaller than the above-mentioned range, it is satisfactory in appearance, but if the roughness is too small, there will be a possibility that processing cost may be high or a yield may be small, and therefore the above-mentioned range is preferable practically. As for image clarity of a designed surface of a fiber reinforced composite material of the present invention, a value of NSIC obtained by measuring in conformity with ASTM D5767 is preferably in the range of from 30 to 80 percents, and is more preferably in the range of from 40 to 70 percents. NSIC takes a value of from 0 to 100 percents, and a value of 100 percents is that of an ideal mirror plane without distortion of an image. Therefore, when aiming a flat and smooth designed surface, it is not preferable that a value of NSIC is smaller than thee above-mentioned range since distortion of an image reflected on the designed surface is large and an esthetic impression is spoiled. And if a value of NSIC is larger than the above-mentioned range, a surrounding scene will be reflected just like a mirror and this is not favored, either.

A fiber reinforced composite material having a designed surface requires that the designed surface should have sufficient hardness. Because a cured product of an epoxy resin composition of the present invention has sufficient hardness, it is mostly satisfactory when applying neither painting nor gelcoating, but when applying painting or gelcoating, it is necessary to choose the characteristics of paint or gelcoat appropriately. A pencil hardness of a designed surface of a fiber reinforced composite material of the present invention, which is measured in conformity with JIS K 5600-5-4 (corresponding to ISO 15184:1996), is preferably F or above. If the pencil hardness is less than F, there is a possibility that the designed surface may be blemished at the time of washing.

Since a fiber reinforced composite of the present invention is excellent in both decorative design and mechanical properties, it can be used for all the applications in which it is observable and requires predetermined mechanical properties. For example, it can be used suitably for a member of sporting goods, such as a golf club, a tennis racket, a badminton racket, a hockey stick, a ski stock, a ski plate, a snowboard, a skateboard, a surfboard, a fishing rod, and the like, and for a member of a vehicle with designed surfaces, such as an aircraft, a spacecraft, a railroad car, an automobile (a passenger car, a racing car, a bus, a van a wagon, a truck, a trailer, and the like), a motor bicycle, a ship, a rowboat, a sailboat, a bicycle and the like, and further for a member of a bathtub or a housing of an electronic apparatus.

We will explain more specifically about the above-mentioned member of sporting goods and a member of a vehicle, taking a member of an automobile with a designed surface as an example.

A fiber reinforced composite material of the present invention can be preferably used especially for an automobile member with a designed surface, that is, an outside plate, an interior material, and an aerodynamic member. Specifically as an outer panel of an automobile, it can be preferably used for a hood, a front fender, a rear fender, a door panel, a roof a trunk lid, a rear window panel, a fuel lid, a garnish, a trim, a grille, a bumper fascia, and the like. As an aerodynamic member of an automobile, it can be preferably used for a rear spoiler, a front air dam, a side air dam, a hubcap, and the like. As an interior material of an automobile, it can be preferably used for an instrument panel, a steering wheel, a dash box, a center console, a seat frame, and the like.

If a fiber reinforced composite material of the present invention is used for these automobile members, it will be possible to lighten the weight of a car and give it aesthetic properties simultaneously.

Because an outer panel of an automobile and an aerodynamic member are exchanged frequently by accident, blemish, breakdown, and the like, if color difference results between an exchanged panel member and an unexchanged panel member, an appearance and design of an automobile itself will be spoiled. A fiber reinforced composite material of the present invention is suitable for an outer panel of an automobile and an aerodynamic member also from this point of view.

A hood, a door panel, a roof a trunk lid, and the like, which have a large surface area are members whose color difference change is easy to be striking and a fiber reinforced composite material of the present invention can be used very preferably for them. And, because a hood, a roof, a trunk lid, and the like, which are horizontal members, are exposed to direct sunlights and they are easy to change color, a fiber reinforced composite material of the present invention applies very preferably to them.

Furthermore, if a member is a panel member having curvature (for example, a trunk lid whose front part is a mostly horizontal plane and whose rear part is a mostly vertical plane), an amount of irradiation will vary within the same member surface and color difference will be easy to result, and therefore, a fiber reinforced composite material of the present invention can be used suitably for a panel member having curvature.

Interior materials of an automobile receive different amounts of irradiation of light according to regions thereof. If a material which is easy to discolor by light is used for interior material, a color tone will vary according to regions thereof by long-term use, and therefore, the beautiful appearance is spoiled. A fiber reinforced composite material of the present invention is suitable for interior materials of an automobile for that reason.

EXAMPLES

Hereafter, the present invention is specifically explained on the basis of examples. In addition, the conditions and results of each example are collectively shown in Tables 1 to 3 mentioned below and those of comparative examples are collectively shown in Table 4. In addition, E380 in the examples means a molecular extinction coefficient measured at 25 degrees Celsius in a chloroform.

Example 1

(1) Preparation of an Epoxy Resin Composition 120.0 parts by weight of 4-methylhexahydrophthalic anhydride (Formula 14, Trade name: Rikacid MH-700, made by New Japan Chemical Co., Ltd.) as a carboxylic anhydride having a cycloalkane ring, and 1.1 parts by weight a 2-(3-tert-butyl-2-hydroxy-5-methylphenyl)-5-chloro-2H-benzotriazol (Formula 29, $\epsilon 380=6.0\times 10^3$, Trade name: ADK STAB LA-36, made by Asahi Denka Co., Ltd.), as a benzotriazol type ultraviolet absorbent were added to 100.0 parts by weight of 3,4-epoxycyclohexylmethyl 3,4-epoxycyclohexanecarboxylate (Formulas 3, Trade name: Celloxide 2021P, made by Daicel Chemical Industries, Ltd.) as an epoxy resin having a 1,2-epoxycyclohexane ring, and the mixture was sufficiently stirred to obtain an epoxy resin composition 1.

(2) Preparation of an Epoxy Resin Cured Product

The above-mentioned epoxy resin composition 1 was injected into a mold with a plate-shaped cavity having a thickness of 2 millimeters, and was heated to cure at 100 degrees Celsius for 4 hours and at 150 degrees Celsius for 10 hours. Thereafter, it was demolded, and an epoxy resin cured product having a thickness of 2 millimeters was prepared.

(3) Measurement of Physical Properties of a Resin Cured Product

A test piece having a width of 10 millimeters and a length of 60 millimeters was cut out from the above-mentioned epoxy resin cured product, a three-point flexural test was performed at a test speed of 2.5 millimeters per minute and at a distance between fulcrums of 32 millimeters, and a flexural modulus was measured according to JIS K7203. The result showed that the flexural modulus was 3.6 GPa.

In the same way, a small 1(½) size test piece was cut out and a tensile elongation was measured according to JIS K7113 (it corresponds to ISO 527-2). The result showed that the tensile elongation was 0.9 percents. These flexural modulus and tensile elongation showed that it had mechanical properties sufficient as a matrix resin used for a fiber reinforced composite material.

(4) Weathering Test of an Epoxy Resin Cured Product

The above-mentioned epoxy resin cured product was cut square 50 millimeters on each side, and it was used as a test piece for weathering test. This test piece was put to a weathering test, using a weatherometer (Metaling Weather Meter M6T, made by Suga Test Instruments Co., Ltd.), which repeated 100 times (namely, 100 hours) a cycle consisting of irradiation for 12 minutes with spraying of water on conditions of a black panel temperature of 63 degrees Celsius and irradiation for 48 minutes without spraying of water on conditions of black panel temperature of 63 degrees Celsius and relative humidity of 50 percents.

(5) Color Difference Measurement

Color difference of the cured product between before and after weathering test was measured using a multiple-light-source spectrophotometric calorimeter (MSC-P, made by Suga Test Instruments Co., Ltd.). First, a test piece (having a thickness of 2 millimeters) before performing the weathering test was set to a multiple-light-source spectrophotometric colorimeter, and a spectral transmittance was measured on measurement conditions of transmission light mode, a C light source, an angle of visibility of 2 degrees, an incidence of 8 degrees, no regular reflection light contained, and a wavelength in the range of from 380 to 780 nanometers. Furthermore, colorimetric values before weathering test in CIE 1976 L*a*b* color system ($L^*_1, a^*_1, b^*_1$), were calculated using a program attached to the equipment. Next, the test piece after performing the weathering test was set to a multiple-light-source spectrum calorimeter, and calorimetric values after the weathering test ($L^*_2, a^*_2, b^*_2$) were calculated by the same method as mentioned above. Furthermore, as a result of finding a color difference of the cured product between before and after the weathering test by the equation (1), the color difference was 0.43, which showed that it had an excellent weatherability.

(6) Preparation of a Fiber Reinforced Composite Material

Four woven carbon fiber fabrics CK6250E (Carbon fiber: T700S-12K, Texture: plain weave, fiber, areal weight: 190 g/m$^2$, made by Toray Industries, Inc.) cut out on 295 millimeters×395 millimeters as a reinforcing fiber were laminated in a 300 millimeter×400 millimeter×5 millimeter plate-shaped cavity of a mold, and the mold was clamped by fitting an upper die. Subsequently, the epoxy resin composition 1 was injected into the mold, and was heated to cure at 100 degrees Celsius for 4 hours and at 150 degrees Celsius for 10 hours, and thereafter was demolded, whereby a fiber reinforced composite material was prepared.

(7) Weathering test and color difference measurement of a fiber reinforced composite material Next, colorimetry and weatherability evaluation of the above-mentioned fiber reinforced composite material were performed. First, a fiber reinforced composite material was cut out into 50 millimeters×50 millimeters, and a spectral reflectance and a colorimetric value were obtained by measuring in the range of from 380 to 780 nanometers on conditions of a C light source, an angle of visibility of 2 degrees, a measuring aperture of 30 millimeters φ, an incidence of 8 degrees, and no regular reflection light contained, using the above-mentioned multiple-light-source spectrophotometric colorimeter MSC-P made by Suga Test Instruments Co., Ltd., and by processing data.

Subsequently, a weathering test of a fiber reinforced composite material was performed. This was performed just like the above-mentioned 100-hour weatherometer test of an epoxy resin cured product. The color difference $\Delta E^*ab$ was 1.83, and an appearance did not change between before and after the weathering test, either, and the appearance was good.

Example 2

(1) Preparation of an Epoxy Resin Composition

As an imidazole compound, 6.6 parts by weight of 1,2-dimethylimidazole (Trade name: Curezol 1,2-DMZ, made by Shikoku Chemicals Corp.) was further added to the epoxy resin composition 1 used in the example 1, and the mixture was sufficiently stirred to obtain an epoxy resin composition 2.

(2) Preparation of an Epoxy Resin Cured Product

An above-mentioned epoxy resin composition 2 was injected into a mold with a plate-shaped cavity having a thickness of 2 millimeters, and was heated to cure at 70 degrees Celsius for 2 hours and at 100 degrees Celsius for 2 hours. Thereafter, it was demolded, and an epoxy resin cured product with a thickness of 2 millimeters was obtained.

(3) Weathering Test, Color Difference Measurement

As a result of performing the weathering test of the cured product in quite the same way as the example 1, the color difference was 0.48, which showed that it had an excellent weatherability.

Example 3

(1) Preparation of an Epoxy Resin Composition

As a polyol having neither aromatic ring nor aminic nitrogen atom, 11.0 parts by weight of diethylene glycol (Wako Pure Chemical Industries, Ltd.) were further added to the epoxy resin composition prepared in the example 2, and the mixture was sufficiently stirred to obtain an epoxy resin composition 3.

In quite the same way as the example 2, the epoxy resin composition 3 was heated to cure, and the weathering test of the cured product was performed. The result showed that the color difference was 3.45 and it had an excellent weatherability.

Example 4

A composition identical with the epoxy resin composition 3 used in the example 3 except having changed an addition of benzotriazol type ultraviolet absorbent ADK STAB LA-36 into 0.2 parts by weight was referred to as an epoxy resin compositions 4.

As a result of performing the weathering test of the cured product of the epoxy resin composition 4 in quite the same way as the example 2, the color difference was 1.37, which showed that it had an excellent weatherability.

Example 5

A composition identical with the epoxy resin compositions 4 used in the example 4 except having added 0.2 parts by weights of a benzotriazol type ultraviolet absorbent, 2-(2-hydroxy-5-methylphenyl)-2H-benzotriazol (Formula 31, $\epsilon 380=9.0\times 10^2$, Trade name: SEESORB 701, made by Shipro Kasei Kaisha Ltd.) instead of ADK STAB LA-36 was referred to as an epoxy resin composition 5.

As a result of performing the weathering test of the cured product of the epoxy resin composition 4 in quite the same way as the example 2, the color difference was 3.01, which showed that it had an excellent weatherability.

Example 6

A composition identical with the epoxy resin composition 4 used in the example 4 except having added 0.2 parts by weight of a benzotriazol type ultraviolet absorbent, 2-(2-hydroxy-3,5-di-tert-pentylphenyl)-2H-benzotriazol (Formula 25, $\epsilon 380=4.6\times 10^3$, Trade name: SEESORB 704, made by Shipro Kasei Kaisha, Ltd.) instead of ADK STAB LA-36 was referred to as an epoxy resin composition 6.

As a result of performing the weathering test of the cured product of the epoxy resin composition 6 in quite the same way as the example 2, the color difference was 1.03, which showed that it had an excellent weatherability.

Example 7

A composition identical with the epoxy resin composition 4 used in the example 4 except having added 0.2 parts by weight of a benzotriazol type ultraviolet absorbent, 2-(2-hydroxy-5-tert-octylphenyl)-2H-benzotriazols (Formula 32, $\epsilon 380=1.9\times 10^3$, Trade name: SEESORB 709, made by Shipro Kasei Kaisha Ltd.) instead of ADK STAB LA-36 was referred to as an epoxy resin composition 7.

As a result of performing the weathering test of the cured product of the epoxy resin composition 7 in quite the same way as the example 2, the color difference was 4.85, which showed that it had an excellent weatherability.

Example 8

A composition identical with the epoxy resin composition 4 used in the example 4 except having added 0.2 parts by weight of a benzophenone type ultraviolet absorbent, 2-hydroxy-4-methoxy benzophenone (Formula 34, $\epsilon 380=2.0\times 10^1$, Trade name: SEESORB 101, made by Shipro Kasei Kaisha, Ltd.) instead of ADK STAB LA-36 was referred to as an epoxy resin composition 8.

As a result of performing the weathering test of the cured product of the epoxy resin composition 8 in quite the same way as the example 2, the color difference was 4.92, which showed that it had an excellent weatherability.

Example 9

A composition identical with the epoxy resin composition 4 used in the example 4 except having added 0.2 parts by weight of a benzophenone type ultraviolet absorbent, 2-benzyloxy-2-hydroxybenzophenone (Formula 37, $\epsilon 380=3.0\times 10^1$, Trade name: SEESORB 105, made by Shipro Kasei Kaisha, Ltd.) instead of ADK STAB LA-36 was referred to as an epoxy resin composition 9.

As a result of performing the weathering test of the cured product of the epoxy resin composition 9 in quite the same way as the example 2, the color difference was 4.72, which showed that it had an excellent weatherability.

Example 10

A composition identical with the epoxy resin composition 4 used in the example 4 except having added 0.2 parts by weight of a benzophenone type ultraviolet absorbent, 2,2'-dihydroxy-4,4'-dimethoxybenzophenone (Formula 39, $\epsilon 380=9.0\times 10^1$, Trade name: SEESORB 107, made by Shipro Kasei Kaisha, Ltd.) instead of ADK STAB LA-36 was referred to as an epoxy resin composition 10.

As a result of carrying out a heating cure of the epoxy resin composition 10 and performing a weathering test in quite the same way as the example 2, the color difference is 2.43, which showed that it had an excellent weatherability.

Example 11

(1) Preparation of an Epoxy Resin Composition 100.8 parts by weight of 4-methylhexahydrophthalic anhydride (Trade name: Rikacid MH-700, made by New Japan Chemical Co., Ltd.) as a carboxylic anhydride having a cycloalkane ring, 0.2 parts by weight of 2-(3,5-di-t-pentyl-2-hydroxyphenyl)-2H-benzotriazol (Trade name: SEESORB 704, made by Shipro Kasei Kaisha, Ltd.) as a benzotriazol type ultraviolet absorbent, 3.0 parts by weight of 1,2-dimethylimidazole (Trade name: Curezole 1,2-DMZ, made by Shikoku Chemicals Corp.) as an imidazole compound, 6.0 parts by weight of diethylene glycol (Wako Pure Chemical Industries, Ltd.) as a polyol having neither aromatic ring nor aminic nitrogen atom were added to 50.0 parts by weight of 3,4-epoxycyclohexylmethyl 3,4-epoxycyclohexanecarboxylate (Trade name: Celloxide 2021P, made by Daicel Chemical Industries, Ltd.), and 50.0 parts by weight of bis(3,4-epoxycyclohexylmethyl) adipate. (Formula 4, Trade name: ERL-4299, made by Union Carbide Japan, Ltd.) as epoxy resins having 1,2-epoxycyclohexane rings at room temperature, and the mixture was sufficiently stirred to obtain an epoxy resin composition 11.

As a result of preparing a cured product in quite the same way as the example 3 and measuring mechanical properties, the flexural modulus was 3.0 GPa and the tensile elongation was 2.1 percents, which showed that it had mechanical properties sufficient as a matrix resin for a fiber reinforced composite materials. Furthermore, as a result of performing the weathering test in quite the same way as the example 1, the color difference was 1.17, which showed that it had an excellent weatherability.

Example 12

(1) Preparation of an Epoxy Resin Composition 110.6 parts by weight of 4-methylhexahydrophthalic anhydride (Trade name: Rikacid MH-700, made by New Japan Chemical Co., Ltd.) as a carboxylic anhydride having a cycloalkane ring, 0.2 parts by weight of 2-(3,5-di-t-pentyl-2-hydroxyphenyl)-2H-benzzotriazol (Trade name: SEESORB 704, Shipro Kasei Kaisha, Ltd.) as a benzotriazol type ultraviolet absorbent, 6.6 parts by weight of 1,2-dimethylimidazole (Trade name: Curezole 1,2-DMZ, made by Shikoku Chemicals Corp.) as an imidazole compound, 11.0 parts by weight of diethylene glycol (Wako Pure Chemical Industries, Ltd.) as a polyol having neither aromatic ring nor aminic nitrogen atom was added to 25 parts by weight of 3,4-epoxycyclohexylmethyl 3,4-epoxycyclohexanecarboxylate (Trade name: Celloxide 2021P, made by Daicel Chemical Industries, Ltd.) and 75 parts by weight of bis(3,4-epoxycyclohexylmethyl) adipate (Trade name: ERL-4299, made by Union Carbide Japan Ltd.) as epoxy resins having 1,2-epoxycyclohexane rings at room temperature, and the mixture was sufficiently stirred to obtained an epoxy resin composition 12.

In quite the same way as the example 3, the epoxy resin composition 12 was heated to cure, and mechanical properties were measured. The result showed that the flexural modulus was 2.9 GPa and the tensile elongation was 4.4 percents and that it had mechanical properties sufficient as a matrix resin for a fiber reinforced composite material. Furthermore, as a result of performing the weathering test in quite the same way as the example 1, the color difference was 0.93, which showed that it had an excellent weatherability.

Comparative Example 1

A resin composition which did not contain the ultraviolet absorbent in the epoxy resin composition 3 used in the example 3 was referred to as an epoxy resin composition 13.

As a result of performing the weathering test of the cured product of the epoxy resin composition 13 in quite the same way as the example 2, the color difference was 6.85, which showed that it had a poor weatherability.

Comparative Example 2

A resin composition which contained 1.1 parts by weight of hindered amine light stabilizing agent, 1,2,2,6,6-pentamethyl-4-piperidyl tridecyl 1,2,3,4-butanetetracarboxylate (Trade name: ADK STAB LA-62, made by Asahi Denka Co., Ltd.) instead of ADK STAB LA-36 in the epoxy resin compositions 3 used in the example 3 was referred to as an epoxy resin composition 14. A hindered amine light stabilizing agent is an additive used often in order to improve weatherability of plastics.

In quite the same way as the example 2, the epoxy resin composition 14 was heated to cure, and the weathering test was performed. The result showed that the color difference was 5.45 and the weatherability was inferior and that a hindered amine light stabilizer was not effective in improvement of weatherproof.

Comparative Example 3

Alicyclic amine (Ancamine 2049, made by PTI Japan, Ltd.) was added to 70.0 parts by weight of bisphenol F type epoxy (Trade name: Epikote 807, made by Japan Epoxy Resins Co., Ltd.) which is an epoxy resin having benzene rings and 30.0 parts by weight of N,N,O-triglycidyl-p-aminophenol (Trade name: Epikote 630, made by Japan Epoxy Resins Co., Ltd.) which is an epoxy resin having a benzene ring and an aminic nitrogen atom, and the mixture was sufficiently stirred to obtain an epoxy resin composition 15. An epoxy resin composition is a model of an epoxy resin composition for conventional common fiber reinforced composite materials.

In quite the same way as the example 3, the epoxy resin composition 15 was heated and cured to prepare a cured product. Furthermore, as a result of measuring a flexural modulus and a tensile elongation of the cured product in quite the same way as the example 1, they are 3.2 GPa and 7.4 percents respectively, which showed that it had mechanical properties sufficient as a matrix resin for a fiber reinforced composite material.

However, as a result of performing the weathering test in quite the same way as the example 3, the color difference was 10.49 and it changed to yellow and it was inferior in weatherability.

Comparative Example 4

0.1 parts by weight of 2-(2'-hydroxy-3'-t-butyl-5-methylphenyl)-5-chloro-benzotriazols (Trade name: ADK STAB LA-36, made by Asahi Denka Co., Ltd.) as a benzotriazol type ultraviolet absorbent were further added to the epoxy resin composition 15 used in the comparative example 3, and the obtained resin composition was referred to as an epoxy resin composition 16.

As a result of preparing a cured product in quite the same way as the example 3 and performing the weathering test, the color difference was 20.97, which was further inferior in weatherability to the above-mentioned epoxy resin 15 which did not contain an ultraviolet absorbent. Like this, even if an ultraviolet absorbent effective in the present invention is added to a conventional common epoxy resin composition, weatherability is not improved but it decreases on the contrary.

Comparative Example 5

111.5 parts by weight of 4-methylhexahydrophthalic anhydride (Trade name: Rikacid MH-700, made by New Japan Chemical Co., Ltd.) as a carboxylic anhydride having a cycloalkane ring, 0.2 parts by weight of 2-(3,5-di-t-pentyl-2-hydroxyphenyl)-2H-benzotriazol (Trade name: SEESORB 704, made by Shipro Kasei Kaisha, Ltd.) as a benzotriazol type ultraviolet absorbent, 6.6 parts by weight of 1,2-dimethylimidazole (Trade name: Curezole 1,2-DMZ, made by Shikoku Chemicals Corp.) as an imidazole compound, and 11.0 parts by weight of diethylene glycol (Wako Pure Chemical Industries, Ltd.) as a polyol having neither aromatic ring nor aminic nitrogen atom were added to 60 parts by weight of 3,4-epoxycyclohexylmethyl 3,4-epoxycyclohexanecarboxylate (Trade name: Celloxide 2021P, made by Daicel Chemical Industries, Ltd.) as an epoxy resin having 1,2-epoxycyclohexane rings, and 40.0 parts by weight of a bisphenol F type epoxy (Trade name: Epikote 807, made by Japan Epoxy Resins Co., Ltd.) which is an epoxy resin having benzene rings at room temperature, and the mixture was referred to as an epoxy resin composition 17.

In quite the same way as the example 3, the epoxy resin composition 17 was heated to cure, and the weathering test was performed. The result showed that the color difference was 12.38 and it changed to yellow and that it was inferior in weatherability.

Tables 1 to 4 summarized the conditions and results of the above examples and comparative examples.

TABLE 1

| | | | Example 1 | | Example 2 | | Example 3 | | Example 4 | | Example 5 | |
|---|---|---|---|---|---|---|---|---|---|---|---|---|
| Epoxy resin composition | Epoxy resin resin | Celloxide 2021P | 100.0 | | 100.0 | | 100.0 | | 100.0 | | 100.0 | |
| | Carboxylic anhydride | Rikacid MH-700 | 120.0 | | 120.0 | | 120.0 | | 120.0 | | 120.0 | |
| | Ultraviolet absorbent | Benzotriazol type | ADK STAB LA-36 $\epsilon 380 = 6.0 \times 10^3$ | 1.1 | | 1.1 | | 1.1 | | 0.2 | | | |
| | | | SEESORB 701 $\epsilon 380 = 9.0 \times 10^2$ | | | | | | | | | 0.2 | |
| | Imidazole compound | Curezole 1,2-DMZ | | | | 6.6 | | 6.6 | | 6.6 | | 6.6 | |
| | Polyol | Diethylene glycol | | | | | | 11.0 | | 11.0 | | 11.0 | |
| Results | Colorimetric value in L*ab color system | | Before test | After test | Before test | After test | Before test | After test | Before test | After test | Before test | After test |
| | | Lightness L* | 96.95 | 96.57 | 96.34 | 96.10 | 95.95 | 94.69 | 96.33 | 95.01 | 96.58 | 95.16 |
| | | Chromaticity a* | −0.50 | −0.68 | −0.50 | −0.68 | −4.78 | −3.38 | −1.90 | −1.56 | −0.51 | −0.60 |
| | | b* | 0.53 | 0.60 | 1.02 | 1.58 | 11.69 | 8.61 | 4.22 | 4.11 | 1.36 | 4.01 |
| | Weatherability | Color difference (ΔE*ab) | 0.43 | | 0.48 | | 3.45 | | 1.37 | | 3.01 | |

TABLE 2

| | | | Example 6 | | Example 7 | | Example 8 | | Example 9 | | Example 10 | |
|---|---|---|---|---|---|---|---|---|---|---|---|---|
| Epoxy resin composition | Expoxy resin | Celloxide 2021P | 100.0 | | 100.0 | | 100.0 | | 100.0 | | 100.0 | |
| | Carboxylic anhydride | Rikacid MH-700 | 120.0 | | 120.0 | | 120.0 | | 120.0 | | 120.0 | |
| | Ultraviolet absorbent | Benzotriazol type | SEESORB 704 $\epsilon 380 = 4.6 \times 10^3$ | 0.2 | | | | | | | | | |
| | | | SEESORB 709 $\epsilon 380 = 1.9 \times 10^3$ | | | 0.2 | | | | | | | |
| | | Benzophenone type | SEESORB 101 $\epsilon 380 = 2.0 \times 10^1$ | | | | | 0.2 | | | | | |
| | | | SEESORB 105 $\epsilon 380 = 3.0 \times 10^1$ | | | | | | | 0.2 | | | |
| | | | SEESORB 107 | | | | | | | | | 0.2 | |
| | Imidazole compund | Curezole 1,2-DMZ | 6.6 | | 6.6 | | 6.6 | | 6.6 | | 6.6 | |
| | Polyol | Diethylene glycol | 11.0 | | 11.0 | | 11.0 | | 11.0 | | 11.0 | |
| Results | Colorimetric value in L*ab color system | | Before test | After test | Before test | After test | Before test | After test | Before test | After test | Before test | After test |
| | | Lightness L* | 96.58 | 95.95 | 96.61 | 91.90 | 96.57 | 94.19 | 96.53 | 95.18 | 96.51 | 94.86 |
| | | Chromaticity a* | −0.36 | −0.43 | −0.38 | −0.43 | −0.48 | −1.44 | −0.42 | −1.59 | −1.68 | −1.60 |
| | | b* | 1.06 | 1.87 | 1.14 | 2.30 | 1.31 | 5.51 | 1.17 | 5.54 | 3.58 | 5.36 |
| | Weatherability | Color difference (ΔE*ab) | 1.03 | | 4.85 | | 4.92 | | 4.72 | | 2.43 | |

TABLE 3

|  |  |  | Example 11 | | Example 12 | |
| --- | --- | --- | --- | --- | --- | --- |
| Epoxy resin composition | Epoxy resin |  | Celloxide 2021P | 50.0 | | 25.0 | |
|  |  | ERL-4299 | 50.0 | | 75.0 | |
|  | Carboxylic anhydride | Rikacid MH-700 | 100.8 | | 110.6 | |
|  | Ultraviolet Benzotriazol absorbent type | SEESORB 704 $\epsilon 380 = 4.6 \times 10^3$ | 0.2 | | 0.2 | |
|  | Imidazole compund | Curezole 1,2-DMZ | 3.0 | | 3.2 | |
|  | Polyol | Diethylene glycol | 6.0 | | 6.3 | |
| Results | Colorimetric value in L*ab color system |  | Before test | After test | Before test | After test |
|  |  | Lightness L* | 96.53 | 95.46 | 96.37 | 95.55 |
|  |  | Chromaticity a* | -0.33 | -0.35 | -0.36 | -0.38 |
|  |  | b* | 1.06 | 1.54 | 1.13 | 1.57 |
|  | Weatherability | Color difference (ΔE*ab) | 1.17 | | 0.93 | |

TABLE 4

|  |  |  |  | Comparative example 1 | | Comparative example 2 | | Comparative example 3 | | Comparative example 4 | | Comparative example 5 | |
| --- | --- | --- | --- | --- | --- | --- | --- | --- | --- | --- | --- | --- | --- |
| Epoxy resin composition | Epoxy resin | Alicyclic | Celloxide 2021P | 100.0 | | 100.0 | | | | | | 60.0 | |
|  |  | Aromatic | Epikote 807 | | | | | 70.0 | | 70.0 | | 40.0 | |
|  |  |  | Epikote 630 | | | | | 30.0 | | 30.0 | | | |
|  | Carboxylic anhydride |  | Rikacid MH-700 | 120.00 | | 120.00 | | | | | | 111.5 | |
|  | Aliphatic amine |  | Ancamine 2049 | | | | | 43.0 | | 43.0 | | | |
|  | Ultraviolet Benzotriazol absorbent type |  | ADK STAB LA-36 | | | | | | | 0.1 | | | |
|  |  |  | SEESORB 704 | | | | | | | | | 0.2 | |
|  | Hindered amine |  | ADK STAB LA-36 | | | 1.1 | | | | | | | |
|  | Imidazole compund |  | Curezole 1,2-DMZ | 6.6 | | 6.6 | | | | | | 6.6 | |
|  | Polyol |  | Diethylene glycol | 11.0 | | 11.0 | | | | | | 11.0 | |
| Results | Colorimetric value in L*ab color system |  |  | Before test | After test | Before test | After test | Before test | After test | Before test | After test | Before test | After test |
|  |  |  | Lightness L* | 96.54 | 94.10 | 96.23 | 94.65 | 95.92 | 94.26 | 96.03 | 88.17 | 96.72 | 91.35 |
|  |  |  | Chromaticity a* | -0.18 | -1.60 | -0.28 | -1.44 | -0.14 | -2.47 | -0.79 | -1.14 | -0.37 | -0.45 |
|  |  |  | b* | 0.70 | 6.94 | 1.06 | 6.14 | 0.65 | 10.74 | 1.74 | 21.18 | 1.23 | -12.38 |
|  | Weatherability |  | Color difference (ΔE*ab) | 6.85 | | 5.45 | | 10.49 | | 20.97 | | 12.38 | |

Example 13

(1) Preparation of epoxy resin composition 91.3 parts by weight of 4-methylhexahydrophthalic anhydride (Trade name: Rikacid MH-700, made by New Japan Chemical Co., Ltd.) as a carboxylic anhydride having a cycloalkane ring, 0.1 parts by weight of 2-(3,5-di-t-pentyl-2-hydroxyphenyl)-2H-benzotriazol (Trade name: SEESORB 704, made by Shipro Kasei Kaisha, Ltd.) as a benzotriazol type ultraviolet absorbent, 5.7 parts by weight of 1,2-dimethylimidazole (Trade name: Curezole 1,2-DMZ, made by Shikoku Chemicals Corp.) as an imidazole compound, 9.6 parts by weight of diethylene glycol (Wako Pure Chemical Industries, Ltd.) as a polyol having neither aromatic ring nor aminic nitrogen atom were added to 25 parts by weight of 3,4-epoxycyclohexylmethyl 3,4-epoxycyclohexanecarboxylate (Trade name: Celloxide 2021 P, made by Daicel Chemical Industries, Ltd.) as an epoxy resin having a 1,2-epoxycyclohexane ring, and 75 parts by weight of bis (3,4-epoxycyclohexylmethyl) adipate (Trade name: ERL-4299, made by Union Carbide Japan. Ltd.) at room temperature, and the mixture was sufficiently stirred to obtain an epoxy resin composition 18.

(2) Flexural modulus of therinosetting matrix resin

The epoxy resin composition 18 warmed at 40 degrees Celsius in advance was injected into a mold having a cavity with a thickness of 2 millimeters, the mold was moved into a hot wind oven at 40 degrees Celsius, and the temperature of the oven was elevated up to 90 degrees Celsius at an elevating rate of 1.5 degrees Celsius per minute, and it was maintained at 90 degrees Celsius for 3 hours to cure. Next, the obtained sample was cut into rectangie, and a flexural modulus in room temperature (23 degrees Celsius) of the thermosetting matrix resin was measured using Instron tester model 1128 (made by Instron Corporation) in conformity with JIS K7203. Consequently, the flexural modulus was 2.9 GPa.

(3) Preparation of Fiber Reinforced Composite

A fiber reinforced composite was prepared by the RTM method using a rigid single-sided mold, a flexible film, and a resin distribution medium.

Figure 2:
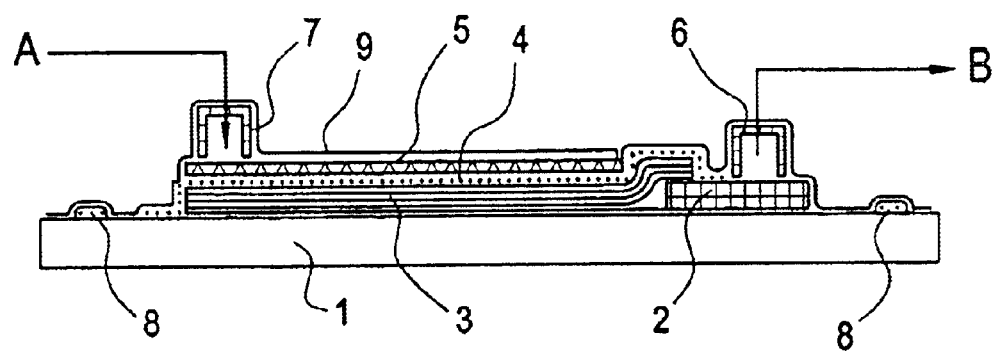
FIG. 2 shows a sectional drawing of a manufacturing apparatus of FIG. 1.

FIG. 1 is a top view of a composite and a manufacturing apparatus during manufacturing a fiber reinforced composite of the present invention, and FIG. 2 is a sectional view sectioned by the arrows A—A of the composite and others of FIG. 1.

In the figures, 1 is an aluminum plate used as a rigid single-sided mold. 2 is a glass fiber woven fabric used as a breather (aeration material), 3 is a carbon fiber woven fabric which is a reinforcing fiber substrate, 4 is a polyester taffeta used as a peel ply (covering material for making separation easy), 5 is a mesh made of plastics which is a resin distribution medium, 6 and 7 are channels made of aluminum for suction of air (comprising a resin) and for injection of a matrix resin, respectively, and a matrix resin can be injected from path A which is a connection path to a matrix resin container which is not illustrated, and on the other hand air can be sucked from inside of reinforcing fibers 2 to 4 to path B which is a connection path to a vacuum pump. In addition, a trap, which is not illustrated, is installed in the suction path B in order to remove a sucked resin. And, 8 is a silicone sealant for preventing air from flowing into inside from outside when pressure is reduced, 9 is a film made of nylon used as a flexible film, 10 and 11 are tubes made of polyethylene used as a suction port of air and an inlet of a matrix resin, respectively.

Using a plate 5.00 millimeters square as aluminum plate 1 of FIG. 1, a mold releasing agent (GA-6010 made by Daikin Industries, Ltd.) was sprayed on the surface thereof. A tape-shaped glass fiber woven fabric 2 was put in parallel on one side of the aluminum plate 1. Using a carbon fiber woven fabric (CK6243C made by Toray Industries, Inc., Carbon-fiber grade: T700S, Texture: plain weave, fiber areal weight: 30.0 g/m$^2$) cut out into 350 millimeters length and 350 millimeters width as a carbon fiber woven fabric 3, seven sheets of these were placed so that one side thereof might overlap slightly with the glass fiber woven fabric 2, as shown in FIG. 2. The carbon fiber woven fabric 3 was covered by a polyester taffeta 4 which was cut out a little larger than the carbon fiber woven fabric 3. And, a mesh 5 made of polypropylene (TSX-160 made by Mitsui Petrochemical Industrial Products, Ltd.) as a resin distribution medium was placed so that the portion of the carbon fiber woven fabric 3 not overlapped with the glass fiber woven fabric 2 might be covered. And an aluminum channel 6 as a suction path of air and resin was placed on the glass fiber woven fabric 3, and another aluminum channel 7 as a resin injection path was placed near the side opposite to the glass fiber woven fabric 2 of the polypropylene mesh 5. A silicone sealant 8 was put on all around the aluminum plate 1, and the whole thereof was covered with a nylon film 9. And a suction port was made by punching the nylon film 9 which covered the end face of the aluminum channel 6 placed on the glass fiber woven fabric 2, inserting a polyethylene tube 10 in this, and sealing the portion where the tube 10 and the film 9 contacted each other by a silicone sealant. Furthermore, an inlet was made by inserting a polyethylene tube 11 also in the side of an aluminum channel 7 placed on the polypropylene mesh 5 similarly.

And the whole of the above-mentioned FIGS. 1 and 2 was placed on a hot plate, the tube 11 of the resin inlet side was connected to a warm water jacketed container of an epoxy resin composition, the tube 10 of a suction port side was connected to a vacuum pump through a glass trap and a valve, and the resin vessel and the whole equipment were warmed at 40 degrees Celsius. The vacuum pump which is not illustrated was operated to suck in, and an epoxy resin composition 18 was injected into the mold. After confirming visually that an epoxy resin composition filled inside the mold and that air hubbies were no longer seen mostly in the epoxy resin composition which flowed out into the trap, the valve was closed, the tubes of the inlet side and the suction side were cut, and the equipment was moved into a hot wind oven at 40 degrees Celsius. Temperature of the oven was elevated up to 90 degrees Celsius at an elevating rate of 1.5 degrees Celsius per minute, and was maintained at 90 degrees Celsius for 3 hours to cure. After curing ended, the equipment was disassembled, a plate of a fiber reinforced composite was taken out, and the mesh made of plastics and the polyester taffeta were taken off.

A content by volume of carbon fiber of the obtained fiber reinforced composite was 53.2 percents.

(4) Measurement of Glass Transition Temperature of a Matrix Resin in a Fiber Reinforced Composite Material And a glass transition temperature of a small piece which was cut out from the above-mentioned fiber reinforced composite material was measured using a differential scanning calorimeter (Model TA3000 made by Mettler) at a temperature elevating rate of 40 degrees Celsius per minute and in a temperature range of from 30 to 300 degrees Celsius. The result showed that it was 92 degrees Celsius.

(5) Measurement of Mechanical Properties of a Fiber Reinforced Composite

Tensile strength at room temperature (23 degrees Celsius) of the above-mentioned fiber reinforced composite was measured using. Instron tester model 1128 (made by Instron Corporation) in conformity with ISO. 527-1, 527-4. The dimension of a test piece was made into a width of 25 millimeters and a length of 250 millimeters, and a tab made of GFRP was adhered on the test piece. The tensile strength was 1160 MPa which was excellent.

(6) Weatherability Measurement of a Fiber Reinforced Composite

A weathering test of the above-mentioned fiber reinforced composite (without painting) was performed for 1500 hours using a sunshine carbon arc tester (made by Suga Test Instruments Co. Ltd.) in conformity with JIS K 5400-1990. Subsequently, a color difference ΔE*ab of the above-mentioned fiber reinforced composite between before and after the weathering test was measured on the condition of a C light source, an angle of visibility of 2 degrees, and measurement aperture of 30 millimeters φ and a reflected light using a spectrophotometric calorimeter (MSC-P made by Suga Test Instruments Co., Ltd.). Consequently, the color difference ΔE*ab between before and after the weathering test was 2.9, which was excellent.

Example 14

A model of a hood of an automobile was molded using a fiber reinforced composite material of the present invention.

Figure 3:
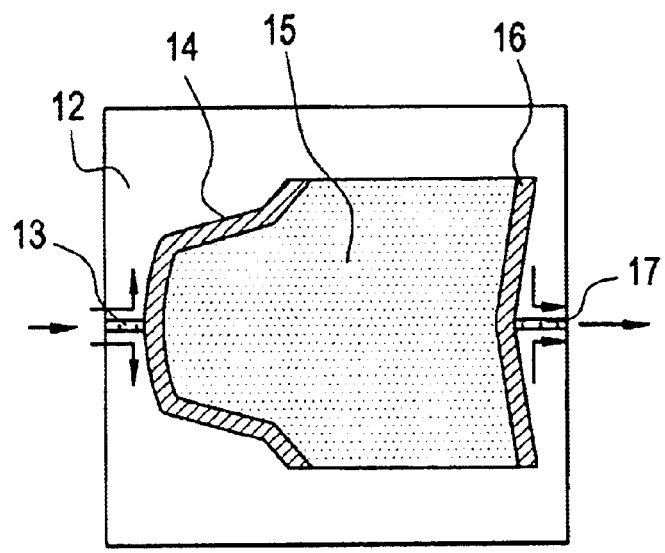
FIG. 3 shows a top plane view of a mold used for example 14.
Figure 4:
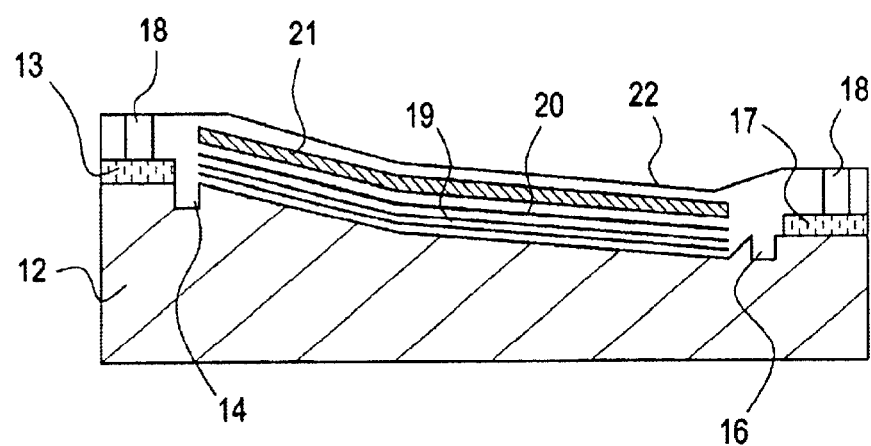
FIG. 4 shows a configuration of reinforcing fibers and submaterials in example 14.

FIG. 3 shows an outline of a mold used, and FIG. 4 shows a configuration of a reinforcing fiber substrate and submaterials. A metal mold 12 is made of iron, and it is equipped with an inlet 13 four injecting a resin, a runner 14 for leading the resin to around a product surface of the mold, a product surface 15 having an average surface roughness Ra of 0.1 micrometers, a runner 16 for collecting an excessive resin, and an outlet 17 of resin.

First, after releasing the metal mold 12, a gelcoat was sprayed on the product surface 15 of the mold using a pressure-feed-type air gun so that a coating thickness might be 0.3 millimeters. The gelcoat was cured by leaving it at room temperature for one day. A compound consisting of 100 parts by weight of NR-AC0001P (made by Ferro Enamels (Japan) Ltd.) and 1 part by weight of Kayamek M (made by Kayaku Akzo Corporation) was used for the gelcoat. Subsequently, six carbon fiber woven fabrics (CK6250E made by Toray Industries, Inc., Carbon fiber grade: T300B, Texture: plain weave, fiber areal weight: 190 g/m$^2$) cut out according to the shape of the product surface 15 as a reinforcing fiber substrate 19 were placed on the product surface 15 of the mold. Next, a peel ply 20 made of nylon (Release Ply A made by, Airteck) was cut out into a shape of the product surface and it was placed on the reinforcing fiber substrate 19. Subsequently, a polypropylene mesh 21 (TSX 160 made by Mitsui Petrochemical Industrial Products, Ltd.) was placed on the peel ply 20 as a resin distribution medium. Further, a silicone sealant 18 was placed around the mold, and by covering with a nylon film 22 and sucking from a resin outlet 17 with a vacuum pump, the pressure of the inside of the mold, that is, the space between the product surface of the metal mold and the nylon film was set to be 0.1 MPa. At this time, temperature of the mold was set to be 90 degrees Celsius.

Subsequently, an epoxy resin composition (the epoxy resin 17 used in the example 13) having a temperature of 30 degrees Celsius was injected into the mold. When the resin had come out of the outlet 17, injection was ended, temperature of the mold was maintained at 90 degrees Celsius for 3 hours to cure the resin. When heating of the mold was ended after that and temperature of the mold became about 50 degrees Celsius, the nylon film, the resin distribution medium, and the peel ply were taken off, and a fiber reinforced composite material having a shape of an automobile hood was removed from the mold.

Surface roughness of the designed surface, that is, the surface having a gelcoat layer which had been in contact with the mold, of the obtained fiber reinforced composite material was measured, which showed that Ra was 0.7 micrometers and Ry was 1.5 micrometers. Image clarity of the designed surface was measured, which showed that NSIC was 45 percents. Pencil hardness of the designed surface was 3H.

Two test pieces in a shape of 5 centimeters square were cut out from the obtained fiber reinforced composite material, and a weatherometer test using a sunshine carbon arc tester (made of Suga Test Instruments Co., Ltd.) was performed for 1500 hours on the same conditions as the example 13. One test piece was placed in the tester so that the designed surface maybe exposed, and the other was placed in the tester so that the opposite surface, that is, the surface having no gelcoat layer may be exposed. The color difference $\Delta E^*ab$ of the designed surface between before and after the weatherometer test is 3.1, and the color difference $\Delta E^*ab$ of the surface having no gelcoat layer was 2.8, both of which showed excellent weatherability.

Industrial Applicability

A cured product of an epoxy resin composition of the present invention and a fiber reinforced composite material of the present invention have extremely excellent weatherability, especially small color change after light irradiation, as well as excellent mechanical properties.

What is claimed is:

1. A fiber reinforced composite material comprising reinforcing fibers and a thermosetting matrix resin, which has a color difference $\Delta E^*ab$ of not more than 4 in a 1500-hour weatherometer test by a sunshine carbon arc light without painting; wherein the thermotsetting matrix resin is a cured epoxy resin product obtained by curing an epoxy resin composition comprising:

(A) an epoxy resin havina a cycloalkane ring or a cyclohexene ring but having neither aromatic ring nor aminic nitrogen atom, (B) a carboxylic anhydride having no aromatic nitrogen atom, and (C) an ultraviolet absorbent, wherein a content of component (A) is from 70 to 100 percent by weight based on the total weight of epoxy resin, and a content of component (B) is from 70 to 100 percent by weight based on the total weight of carboxylic anhydride.

2. A fiber reinforced composite material according to claim 1, wherein the flexural modulus at room temperature of the thermosetting matrix resin is not less than 2.9 GPa.

3. A fiber reinforced composite material according to claim 1, wherein glass transition temperature of the thermosetting matrix resin is not less than 90 degrees Celsius.

4. A fiber reinforced composite material according to claim 1, wherein the reinforcing fibers are carbon fibers.

5. A fiber reinforced composite material which further comprises a transparent resin layer on an outside surface of a fiber reinforced composite material of claim 1.

6. A fiber reinforced composite material according to claim 5, which has a color difference $\Delta E^*ab$ of not more than 4 in a 1500-hour weatherometer test by a sunshine carbon arc light.

7. A fiber reinforced composite material according to claim 5, having an average-of-roughness-height Ra in roughness measurement of a designed surface from 0.05 to 2.0 micrometers.

8. A fiber reinforced composite material according to claim 5, having a maximum height Ry in roughness measurement of a designed surface from 0.1 to 5.0 micrometers.

9. A fiber reinforced composite material according to claim 5, having an image clarity index NSIC of a designed surface from 30 to 80 percents.

10. A fiber reinforced composite material according to claim 5, having a pencil hardness of a designed surface being F or above.

11. A vehicle member comprising a fiber reinforced composite material of claim 5.

12. A sporting goods member comprising a fiber reinforced composite material of claim 1.

* * * * *

UNITED STATES PATENT AND TRADEMARK OFFICE
CERTIFICATE OF CORRECTION

PATENT NO. : 6,902,811 B2
DATED : June 7, 2005
INVENTOR(S) : Oosedo et al.

It is certified that error appears in the above-identified patent and that said Letters Patent is hereby corrected as shown below:

Column 21,
Line 36, change "E380" to -- $\varepsilon$380 --.

Column 27,
Table 2, Row 3, the next line after "SEESORB 107" insert -- $\varepsilon 380 = 9.0 \times 10^3$ --.

Signed and Sealed this

Twenty-fourth Day of January, 2006

JON W. DUDAS
*Director of the United States Patent and Trademark Office*

UNITED STATES PATENT AND TRADEMARK OFFICE
CERTIFICATE OF CORRECTION

PATENT NO.        : 6,902,811 B2
APPLICATION NO.   : 10/362701
DATED             : June 7, 2005
INVENTOR(S)       : Oosedo et al.

Page 1 of 1

It is certified that error appears in the above-identified patent and that said Letters Patent is hereby corrected as shown below:

Column 27,
Table 1, column 2, Row 1, change "Epoxy resin resin" to -- Epoxy resin --.
Table 1, column 1, bridging lines 1 and 2, after "Epoxy resin composition" insert -- (parts by weight) --.
Table 2, column 1, bridging lines 1 and 2, after "Epoxy resin composition" insert -- (parts by weight) --.

Column 29,
Table 3, column 1, bridging lines 1 and 2, after "Epoxy resin composition" insert -- (parts by weight) --.
Table 4, column 1, bridging lines 1 and 2, after "Epoxy resin composition" insert -- (parts by weight) --.

Signed and Sealed this

Twenty-seventh Day of June, 2006

JON W. DUDAS
*Director of the United States Patent and Trademark Office*